(12) United States Patent
Chen et al.

(10) Patent No.: US 11,830,821 B2
(45) Date of Patent: Nov. 28, 2023

(54) SEMICONDUCTOR DEVICES AND METHODS OF MANUFACTURE

(71) Applicant: Taiwan Semiconductor Manufacturing Co., Ltd., Hsinchu (TW)

(72) Inventors: Chih-Hao Chen, Taipei (TW); Pu Wang, Hsinchu (TW); Li-Hui Cheng, New Taipei (TW); Szu-Wei Lu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/150,300

(22) Filed: Jan. 15, 2021

(65) Prior Publication Data

US 2022/0122922 A1    Apr. 21, 2022

Related U.S. Application Data

(60) Provisional application No. 63/093,353, filed on Oct. 19, 2020.

(51) Int. Cl.
*H01L 23/538* (2006.01)
*H01L 25/10* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............ H01L 23/5389; H01L 21/4853; H01L 21/4857; H01L 21/565; H01L 21/568; H01L 21/6835; H01L 23/3128; H01L 23/5383; H01L 23/5386; H01L 24/19; H01L 24/20; H01L 25/0657; H01L 25/105; H01L 25/50; H01L 2221/68372; H01L 2224/214; H01L 2225/0651; H01L 2225/1035; H01L 2225/1058; H01L 2221/68345; H01L 2221/68359;
(Continued)

(56) References Cited

U.S. PATENT DOCUMENTS 7,906,857 B1 * 3/2011 Hoang ................ H01L 23/4334
438/106
8,361,842 B2    1/2013 Yu et al.
(Continued)

FOREIGN PATENT DOCUMENTS

DE    102019104259 A1    4/2020
KR    101531746 B1    7/2015
(Continued)

*Primary Examiner* — Kyoung Lee
*Assistant Examiner* — Christina A Sylvia
(74) *Attorney, Agent, or Firm* — Slater Matsil, LLP

(57) ABSTRACT

Semiconductor devices and methods of manufacture are provided, in which an adhesive is removed from a semiconductor die embedded within an encapsulant, and an interface material is utilized to remove heat from the semiconductor device. The removal of the adhesive leaves behind a recess adjacent to a sidewall of the semiconductor, and the recess is filled.

20 Claims, 28 Drawing Sheets

(51) Int. Cl.

| | | |
|---|---|---|
| *H01L 23/00* | (2006.01) | |
| *H01L 23/31* | (2006.01) | |
| *H01L 21/683* | (2006.01) | |
| *H01L 21/48* | (2006.01) | |
| *H01L 21/56* | (2006.01) | |
| *H01L 25/00* | (2006.01) | |
| *H01L 25/065* | (2023.01) | |

(52) U.S. Cl.
CPC .......... *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 24/19* (2013.01); *H01L 24/20* (2013.01); *H01L 25/0657* (2013.01); *H01L 25/105* (2013.01); *H01L 25/50* (2013.01); *H01L 2221/68372* (2013.01); *H01L 2224/214* (2013.01); *H01L 2225/0651* (2013.01); *H01L 2225/1035* (2013.01); *H01L 2225/1058* (2013.01)

(58) Field of Classification Search
CPC ......... H01L 25/16; H01L 21/50; H01L 21/56; H01L 23/3114; H01L 23/3121; H01L 23/3142; H01L 23/367; H01L 25/0652; H01L 2225/06513; H01L 2225/06551
See application file for complete search history.

(56) References Cited

U.S. PATENT DOCUMENTS

| | | |
|---|---|---|
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 9,583,420 B2 | 2/2017 | Lin et al. |
| 10,163,825 B1 * | 12/2018 | Liao .................. H01L 23/49811 |
| 2003/0020151 A1 | 1/2003 | Chen et al. |
| 2009/0284947 A1 | 11/2009 | Beddingfield et al. |
| 2011/0291288 A1 | 12/2011 | Wu et al. |
| 2012/0172495 A1 * | 7/2012 | Czubarow ............. H01L 21/563 |
| | | 106/287.18 |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2013/0341784 A1 | 12/2013 | Lin et al. |
| 2014/0057391 A1 | 2/2014 | Lin et al. |
| 2014/0124955 A1 | 5/2014 | Chen et al. |
| 2014/0203429 A1 | 7/2014 | Yu et al. |
| 2014/0210099 A1 | 7/2014 | Hu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0187710 A1 | 7/2015 | Scanlan et al. |
| 2017/0033080 A1 | 2/2017 | Chen et al. |
| 2017/0271227 A1 * | 9/2017 | Liao .................. H01L 21/6835 |
| 2018/0082936 A1 * | 3/2018 | Syu .................. H01L 23/4334 |
| 2018/0350755 A1 * | 12/2018 | Huang .................. H01L 25/18 |
| 2019/0006200 A1 * | 1/2019 | Lin .......... H01L 25/50 |
| 2019/0027446 A1 * | 1/2019 | Cheng ................ H01L 23/5384 |
| 2019/0148302 A1 | 5/2019 | Tseng et al. |
| 2019/0206824 A1 * | 7/2019 | Lu .......................... H01L 24/20 |

FOREIGN PATENT DOCUMENTS

| | | |
|---|---|---|
| KR | 20160091211 A | 8/2016 |
| KR | 20190003291 A | 1/2019 |
| TW | 201409660 A | 3/2014 |

* cited by examiner

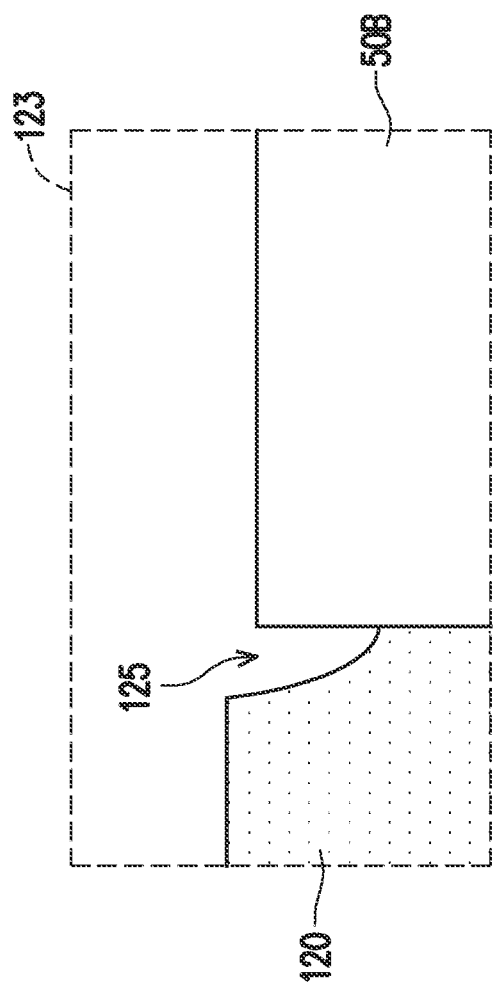

SEMICONDUCTOR DEVICES AND METHODS OF MANUFACTURE

PRIORITY CLAIM AND CROSS-REFERENCE

This application claims the benefit of U.S. Provisional Application No. 63/093,353, filed on Oct. 19, 2020, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 14A-14C illustrate a removal of an adhesive, in accordance with an embodiment.

DETAILED DESCRIPTION

Figure 1:
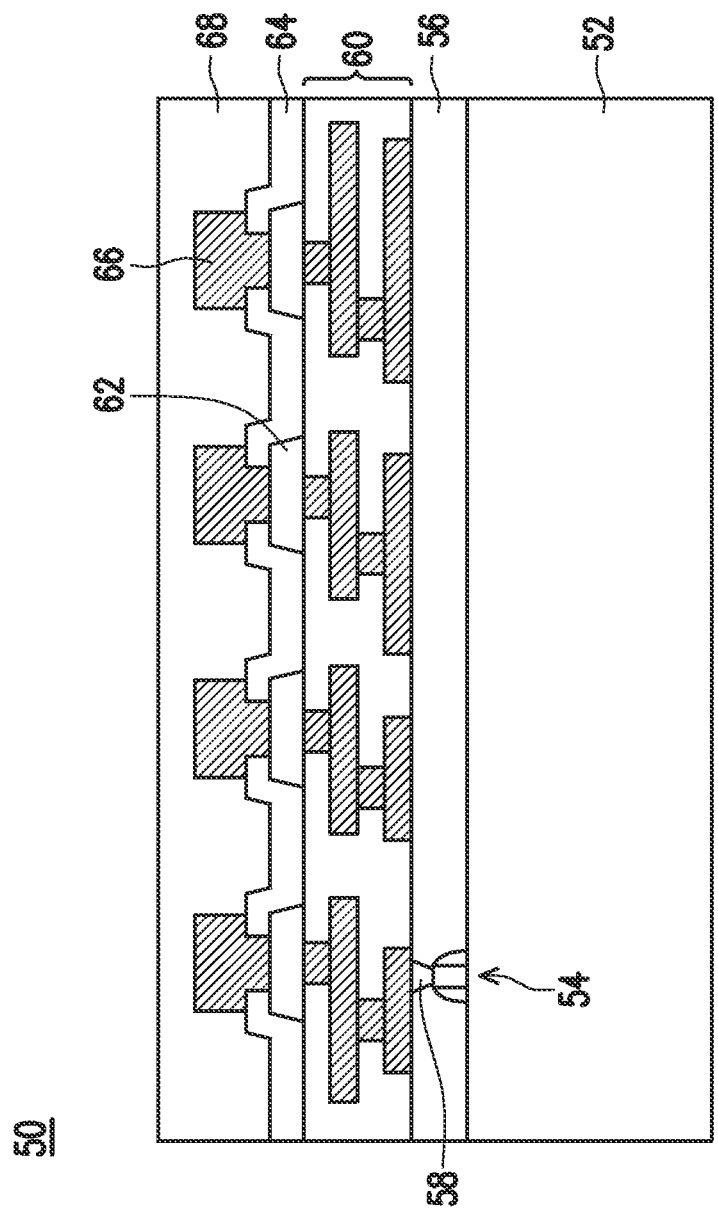
FIG. 1 illustrates a cross-sectional view of an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular structures and methods in which an interface material is utilized to provide an interface within an integrated fan out package. The embodiments described herein, however, are not intended to be limited to the embodiments described, and the embodiments may be implemented in any suitable structures and methods, such as integrated fan-out large scale integration structures (InFO-LSI), integrated fan out multichip structure (InFO-M), a chip on wafer on substrate (CoWoS) structure, or a system on integrated circuit (SoIC) structure. All such embodiments are fully intended to be included within the scope of the embodiments.

FIG. 1 illustrates a cross-sectional view of an integrated circuit die 50 in accordance with some embodiments. The integrated circuit die 50 will be packaged in subsequent processing to form an integrated circuit package. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices (represented by a transistor) 54 may be formed at the front surface of the semiconductor substrate 52. The devices 54 may be active devices (e.g., transistors, diodes, etc.), capacitors, resistors, etc. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the active side of the integrated circuit die 50, such as in and/or on the interconnect structure 60. One or more passivation films 64 are on the integrated circuit die 50, such as on portions of the interconnect structure 60 and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit die 50.

Optionally, solder regions (e.g., solder balls or solder bumps) may be disposed on the pads 62. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing and are packaged, and dies, which fail the CP testing, are not packaged. After testing, the solder regions may be removed in subsequent processing steps.

A dielectric layer 68 may (or may not) be on the active side of the integrated circuit die 50, such as on the passivation films 64 and the die connectors 66. The dielectric layer 68 laterally encapsulates the die connectors 66, and the dielectric layer 68 is laterally coterminous with the integrated circuit die 50. Initially, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may bury the solder regions as well. Alternatively, the solder regions may be removed prior to forming the dielectric layer 68.

The dielectric layer 68 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 68 may be formed, for example, by spin coating, lamination, chemical vapor deposition (CVD), or the like. In some embodiments, the die connectors 66 are exposed through the dielectric layer 68 during formation of the integrated circuit die 50. In some embodiments, the die connectors 66 remain buried and are exposed during a subsequent process for packaging the integrated circuit die 50. Exposing the die connectors 66 may remove any solder regions that may be present on the die connectors 66.

In some embodiments, the integrated circuit die 50 is a stacked device that includes multiple semiconductor substrates 52. For example, the integrated circuit die 50 may be a memory device such as a hybrid memory cube (HMC) module, a high bandwidth memory (HBM) module, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure 60.

FIGS. 2 through 20 illustrate cross-sectional views of intermediate steps during a process for forming a first package component 100, in accordance with some embodiments. A first package region 100A and a second package region 100B are illustrated, and one or more of the integrated circuit dies 50 are packaged to form an integrated circuit package in each of the package regions 100A and 100B. The integrated circuit packages may also be referred to as integrated fan-out (InFO) packages.

Figure 2:
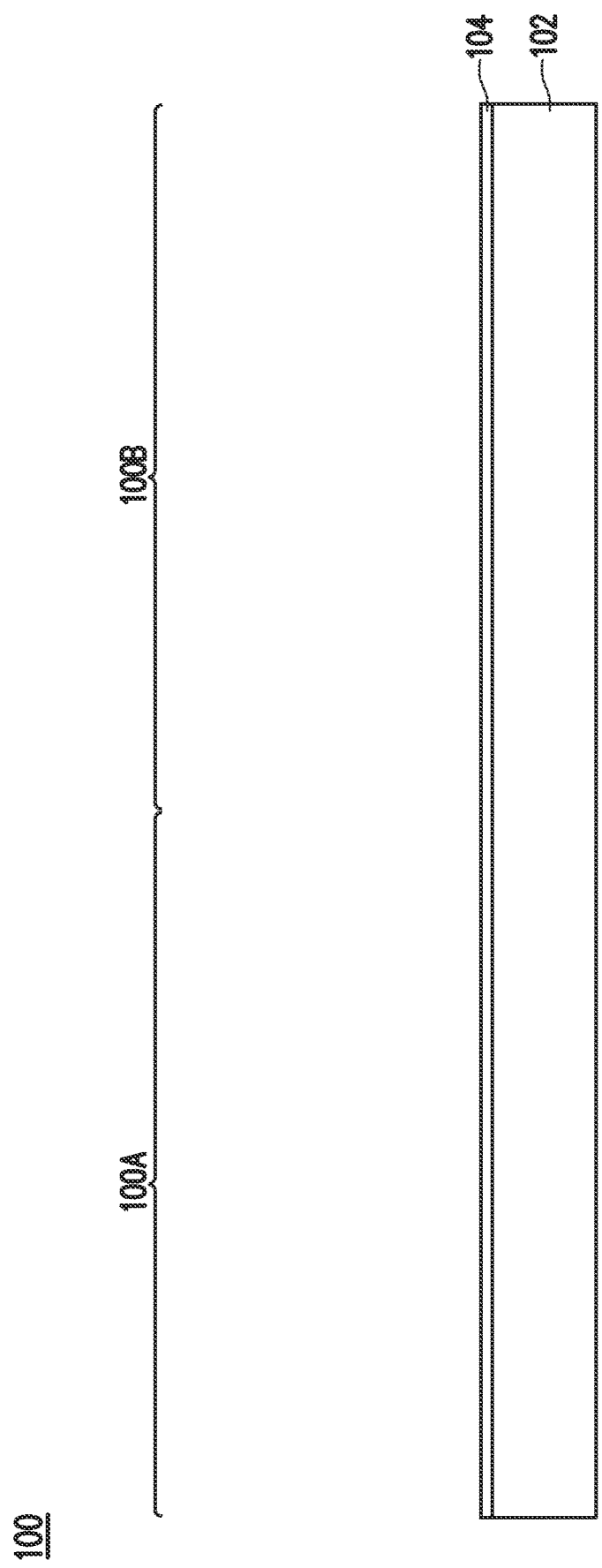
FIG. 2 illustrates an adhesion layer on a carrier substrate, in accordance with an embodiment.

In FIG. 2, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Optionally, a back-side redistribution structure (not separately illustrated) may be formed on the release layer 104. In the embodiment shown, the back-side redistribution structure includes a dielectric layer, a metallization pattern (sometimes referred to as redistribution layers or redistribution lines), and a dielectric layer. In some embodiments, a dielectric layer without metallization patterns is formed on the release layer 104 in lieu of the back-side redistribution structure.

The dielectric layer may be formed on the release layer 104. The bottom surface of the dielectric layer may be in contact with the top surface of the release layer 104. In some embodiments, the dielectric layer is formed of a polymer, such as polybenzoxazole (PBO), polyimide, benzocyclobutene (BCB), or the like. In other embodiments, the dielectric layer is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer may be formed by any acceptable deposition process, such as spin coating, CVD, laminating, the like, or a combination thereof.

The metallization pattern may be formed on the dielectric layer. As an example to form metallization pattern, a seed layer is formed over the dielectric layer. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist (not shown) is then formed and patterned on the seed layer. The photoresist may be formed by spin coating or the like and may be exposed to light for patterning. The pattern of the photoresist corresponds to the metallization pattern. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern.

The dielectric layer may be formed on the metallization pattern and the dielectric layer. In some embodiments, the dielectric layer is formed of a polymer, which may be a photo-sensitive material such as PBO, polyimide, BCB, or the like, that may be patterned using a lithography mask. In other embodiments, the dielectric layer is formed of a nitride such as silicon nitride; an oxide such as silicon oxide, PSG, BSG, BPSG; or the like. The dielectric layer may be formed by spin coating, lamination, CVD, the like, or a combination thereof. The dielectric layer is then patterned to form openings exposing portions of the metallization pattern. The patterning may be formed by an acceptable process, such as by exposing the dielectric layer to light when the dielectric layer is a photo-sensitive material or by etching using, for example, an anisotropic etch. If the dielectric layer is a photo-sensitive material, the dielectric layer can be developed after the exposure.

In some embodiments, the back-side redistribution structure may include any number of dielectric layers and metallization patterns. If more dielectric layers and metallization patterns are to be formed, steps and processes discussed above may be repeated. The metallization patterns may include one or more conductive elements. The conductive elements may be formed during the formation of the metallization pattern by forming the seed layer and conductive material of the metallization pattern over a surface of the underlying dielectric layer and in the opening of the underlying dielectric layer, thereby interconnecting and electrically coupling various conductive lines.

Figure 3:
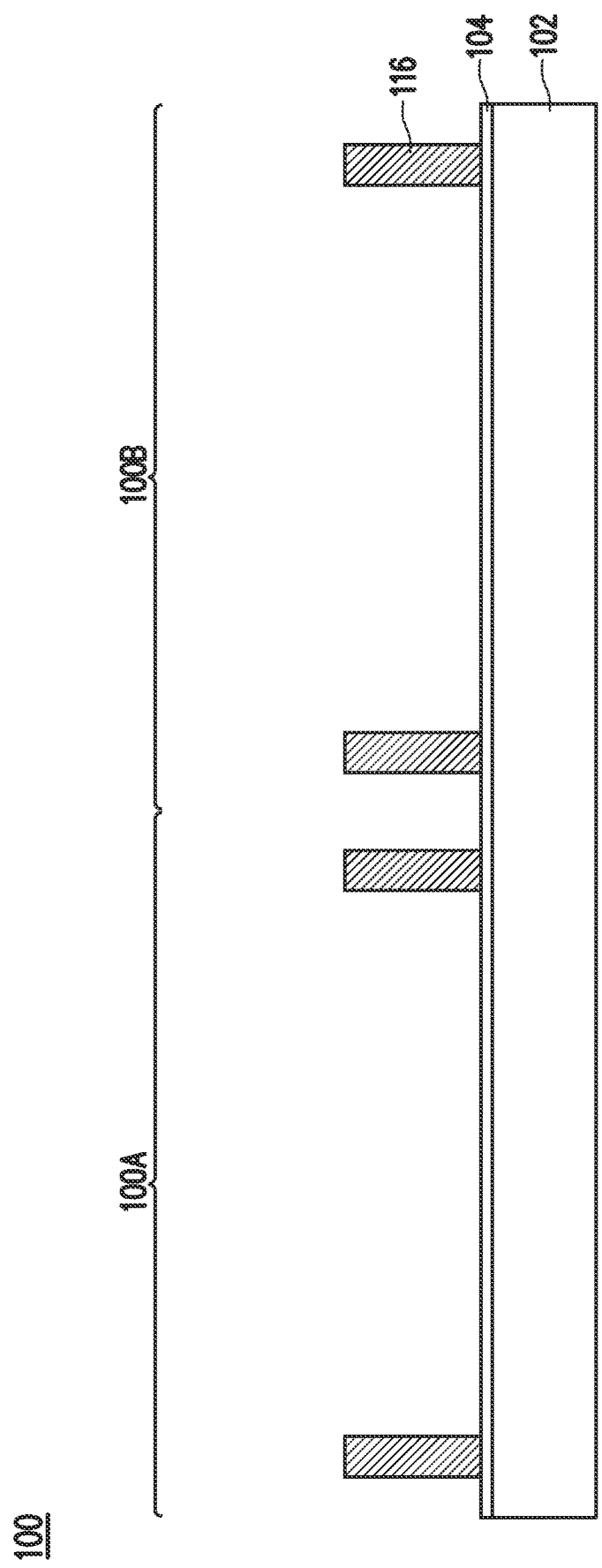
FIG. 3 illustrates formation of through vias, in accordance with an embodiment.

In FIG. 3, through vias 116 are formed on the release layer 104 or, if present, the backside redistribution structure. As an example to form the through vias 116, a seed layer (not shown) is formed over the release layer 104. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 116.

Figure 4A:
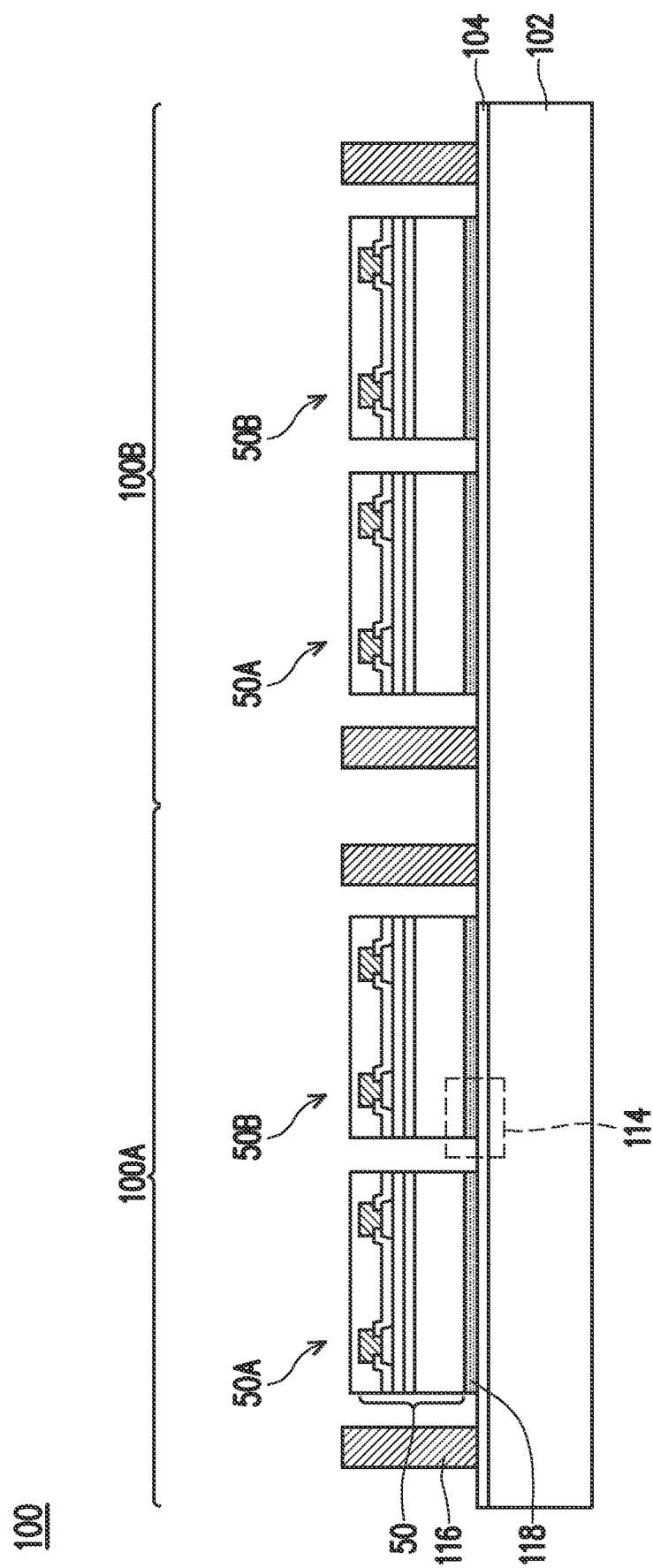
FIGS. 4A-4B illustrate placement of the integrated circuit die, in accordance with an embodiment.

In FIG. 4A, integrated circuit dies 50 (e.g., a first integrated circuit die 50A and a second integrated circuit die 50B) are adhered to the release layer 104 by an adhesive 118. A desired type and quantity of integrated circuit dies 50 are adhered in each of the package regions 100A and 100B. In the embodiment shown, multiple integrated circuit dies 50 are adhered adjacent one another, including the first integrated circuit die 50A and the second integrated circuit die 50B in each of the first package region 100A and the second package region 100B. The first integrated circuit die 50A may be a logic device, such as a central processing unit (CPU), a graphics processing unit (GPU), a system-on-a-chip (SoC), a microcontroller, or the like. The second integrated circuit die 50B may be a memory device, such as a dynamic random access memory (DRAM) die, a static random access memory (SRAM) die, a hybrid memory cube (HMC) module, a high bandwidth memory (HBM) module, or the like. In some embodiments, the integrated circuit dies 50A and 50B may be the same type of dies, such as SoC dies. The first integrated circuit die 50A and second integrated circuit die 50B may be formed in processes of a same technology node, or may be formed in processes of different technology nodes. For example, the first integrated circuit die 50A may be of a more advanced process node than the second integrated circuit die 50B. The integrated circuit dies 50A and 50B may have different sizes (e.g., different heights and/or surface areas), or may have the same size (e.g., same heights and/or surface areas). The space available for the through vias 116 in the first package region 100A and the second package region 100B may be limited, particularly when the integrated circuit dies 50 include devices with a large footprint, such as SoCs.

The adhesive 118 is on back-sides of the integrated circuit dies 50 and adheres the integrated circuit dies 50 to the carrier substrate 102. The adhesive 118 may be any suitable adhesive, epoxy, die attach film (DAF), or the like. The adhesive 118 may be applied to back-sides of the integrated circuit dies 50, may be applied over the surface of the carrier substrate 102 if no back-side redistribution structure is utilized, or may be applied to an upper surface of the back-side redistribution structure if applicable. For example, the adhesive 118 may be applied to the back-sides of the integrated circuit dies 50 before singulating to separate the integrated circuit dies 50.

Figure 4B:
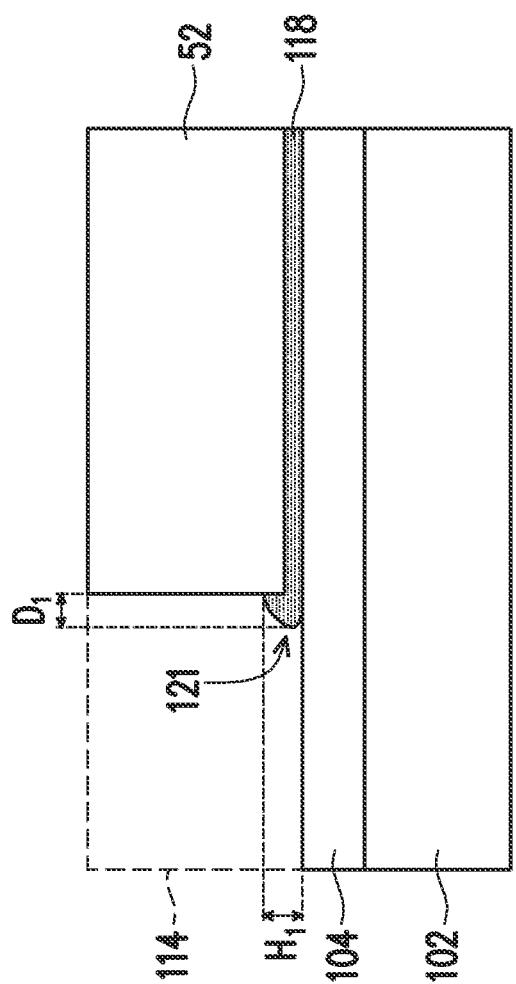

FIG. 4B illustrates a close-up view of the dashed box labeled 114 in FIG. 4A. As can be seen, after placement of the adhesive 118 onto the surfaces (e.g., either the integrated circuit dies 50 or the release layer 104) and after placement of the integrated circuit dies 50, the adhesive 118 is compressed and extends beyond the outside sidewalls of the integrated circuit dies 50 to form an extension 121. In an embodiment the extension 121 of the adhesive 118 may extend a first distance $D_1$ of between about 1 μm and about 30 μm. Additionally, the adhesive 118 that is not located beneath the integrated circuit dies 50 may have a first height $H_1$ that is larger than a height of the adhesive 118 beneath the integrated circuit dies 50, such as having a first height $H_1$ of between about 1 μm and about 30 μm. However, any suitable heights may be utilized.

Figure 5:
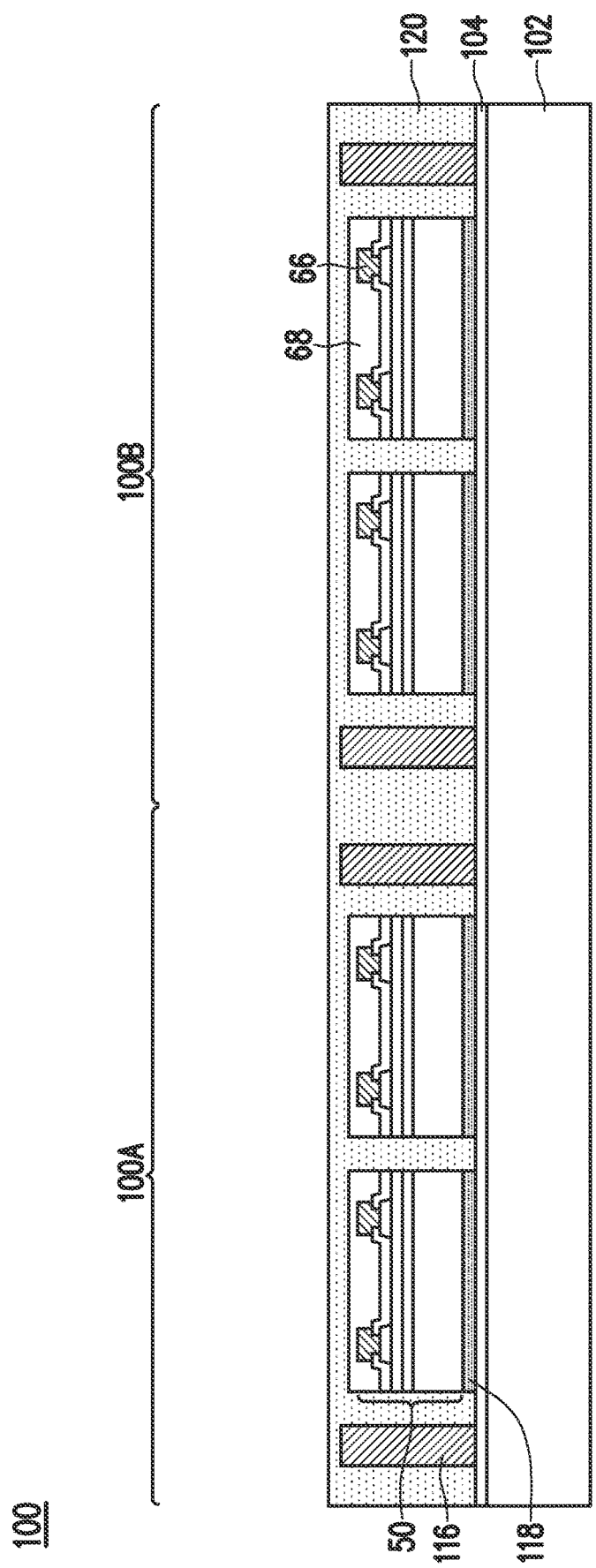
FIG. 5 illustrates an encapsulant, in accordance with an embodiment.

In FIG. 5, an encapsulant 120 is formed on and around the various components and in physical contact with the extensions 121. After formation, the encapsulant 120 encapsulates the through vias 116 and integrated circuit dies 50. The encapsulant 120 may be a molding compound, epoxy, or the like. The encapsulant 120 may be applied by compression molding, transfer molding, or the like, and may be formed over the carrier substrate 102 such that the through vias 116 and/or the integrated circuit dies 50 are buried or covered. The encapsulant 120 is further formed in gap regions between the integrated circuit dies 50. The encapsulant 120 may be applied in liquid or semi-liquid form and then subsequently cured.

Figure 6:
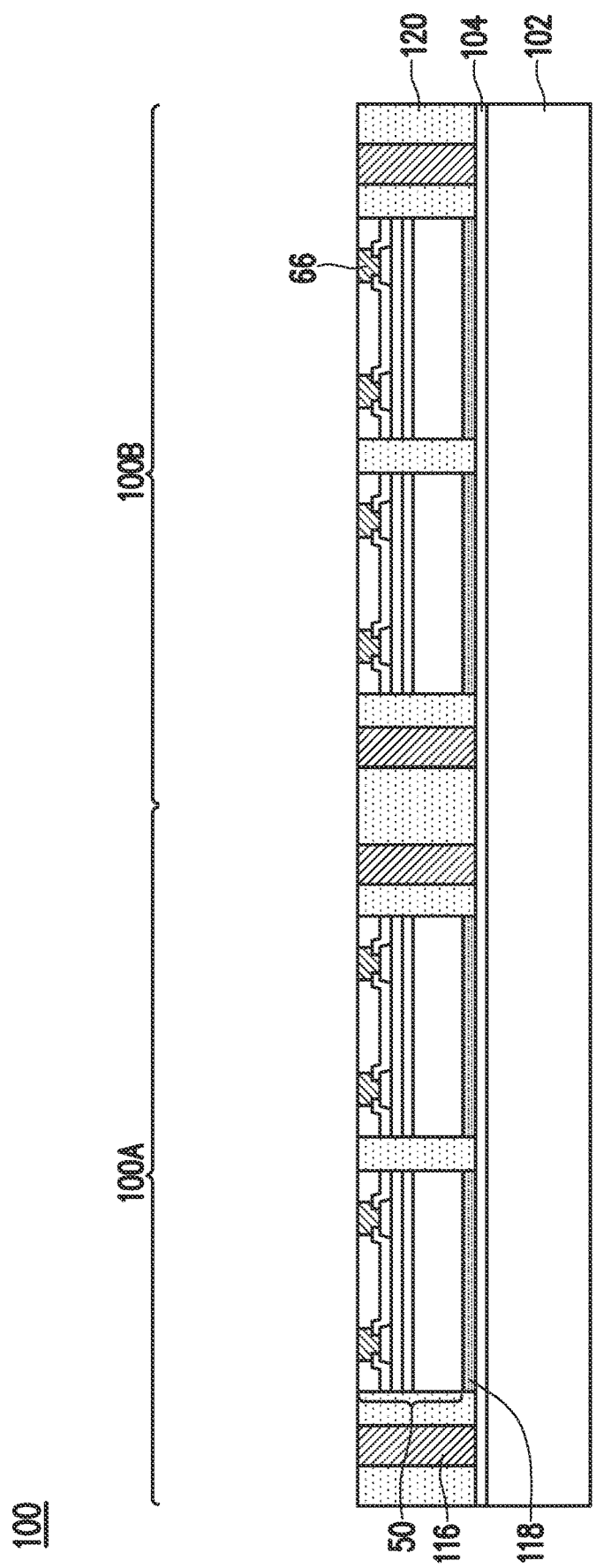
FIG. 6 illustrates a planarization of the encapsulant, in accordance with an embodiment.

In FIG. 6, a planarization process is performed on the encapsulant 120 to expose the through vias 116 and the die connectors 66. The planarization process may also remove material of the through vias 116, dielectric layer 68, and/or die connectors 66 until the die connectors 66 and through vias 116 are exposed. Top surfaces of the through vias 116, die connectors 66, dielectric layer 68, and encapsulant 120 are substantially coplanar after the planarization process within process variations. The planarization process may be, for example, a chemical-mechanical polish (CMP), a grinding process, or the like. In some embodiments, the planarization may be omitted, for example, if the through vias 116 and/or die connectors 66 are already exposed.

In FIGS. 7 through 10, a front-side redistribution structure 122 (see FIG. 10) is formed over the encapsulant 120, through vias 116, and integrated circuit dies 50. The front-side redistribution structure 122 includes dielectric layers 124, 128, 132, and 136; and metallization patterns 126, 130, and 134. The metallization patterns may also be referred to as redistribution layers or redistribution lines. The front-side redistribution structure 122 is shown as an example having three layers of metallization patterns. More or fewer dielectric layers and metallization patterns may be formed in the front-side redistribution structure 122. If fewer dielectric layers and metallization patterns are to be formed, steps and process discussed below may be omitted. If more dielectric layers and metallization patterns are to be formed, steps and processes discussed below may be repeated.

Figure 7:
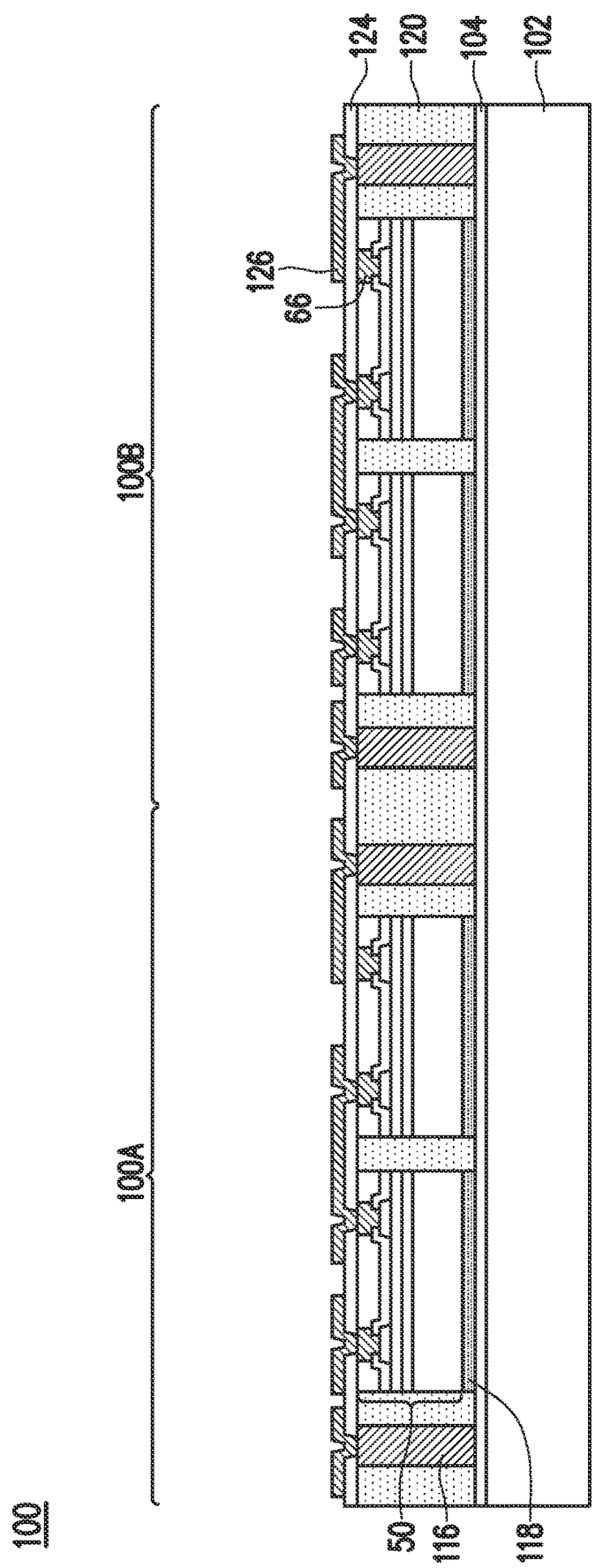
FIGS. 7-10 illustrate formation of a redistribution structure, in accordance with an embodiment.

In FIG. 7, the dielectric layer 124 is deposited on the encapsulant 120, through vias 116, and die connectors 66. In some embodiments, the dielectric layer 124 is formed of a photo-sensitive material such as PBO, polyimide, BCB, or the like, which may be patterned using a lithography mask. The dielectric layer 124 may be formed by spin coating, lamination, CVD, the like, or a combination thereof. The dielectric layer 124 is then patterned. The patterning forms openings exposing portions of the through vias 116 and the die connectors 66. The patterning may be by an acceptable process, such as by exposing and developing the dielectric layer 124 to light when the dielectric layer 124 is a photo-sensitive material or by etching using, for example, an anisotropic etch.

The metallization pattern 126 is then formed. The metallization pattern 126 includes conductive elements extending along the major surface of the dielectric layer 124 and extending through the dielectric layer 124 to physically and electrically couple to the through vias 116 and the integrated circuit dies 50. As an example to form the metallization pattern 126, a seed layer is formed over the dielectric layer 124 and in the openings extending through the dielectric layer 124. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 126. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 126. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 8:
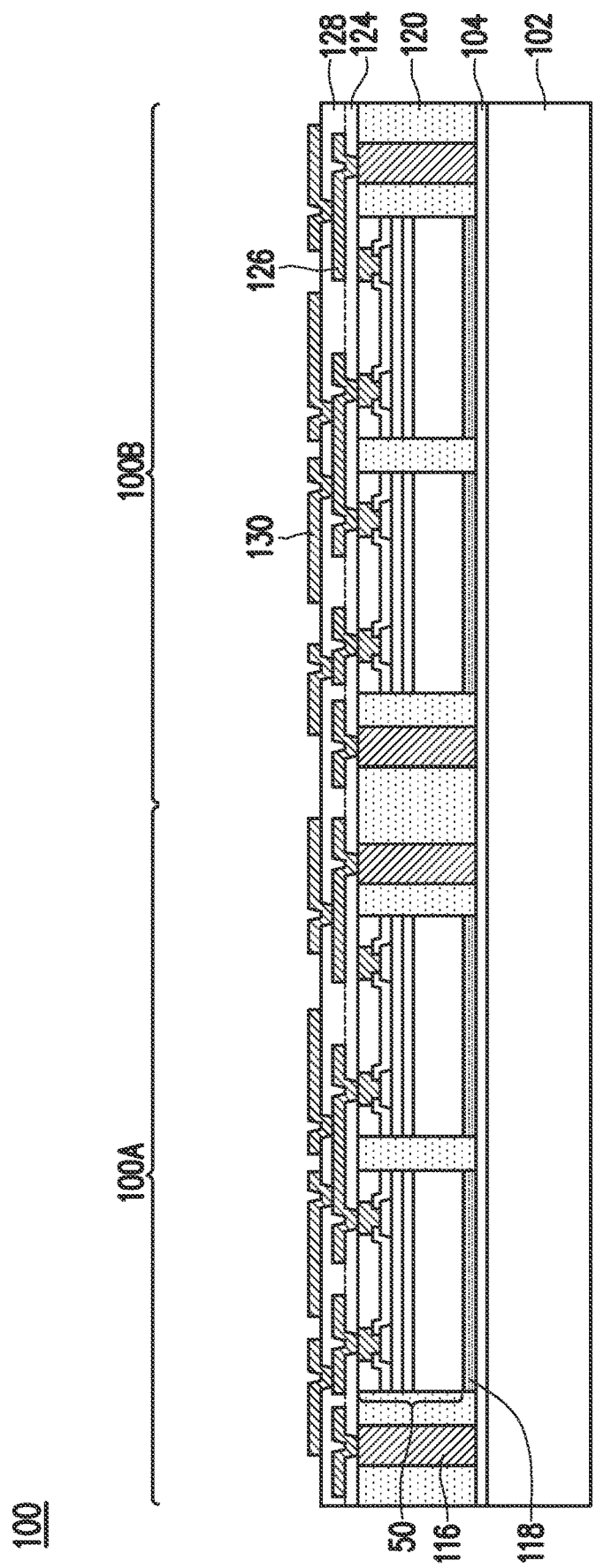

In FIG. 8, the dielectric layer 128 is deposited on the metallization pattern 126 and the dielectric layer 124. The dielectric layer 128 may be formed in a manner similar to the dielectric layer 124, and may be formed of a similar material as the dielectric layer 124.

The metallization pattern 130 is then formed. The metallization pattern 130 includes portions on and extending along the major surface of the dielectric layer 128. The metallization pattern 130 further includes portions extending through the dielectric layer 128 to physically and electrically couple the metallization pattern 126. The metallization pattern 130 may be formed in a similar manner and of a similar material as the metallization pattern 126. In some embodiments, the metallization pattern 130 has a different size than the metallization pattern 126. For example, the conductive lines and/or vias of the metallization pattern 130 may be wider or thicker than the conductive lines and/or vias of the metallization pattern 126. Further, the metallization pattern 130 may be formed to a greater pitch than the metallization pattern 126.

Figure 9:
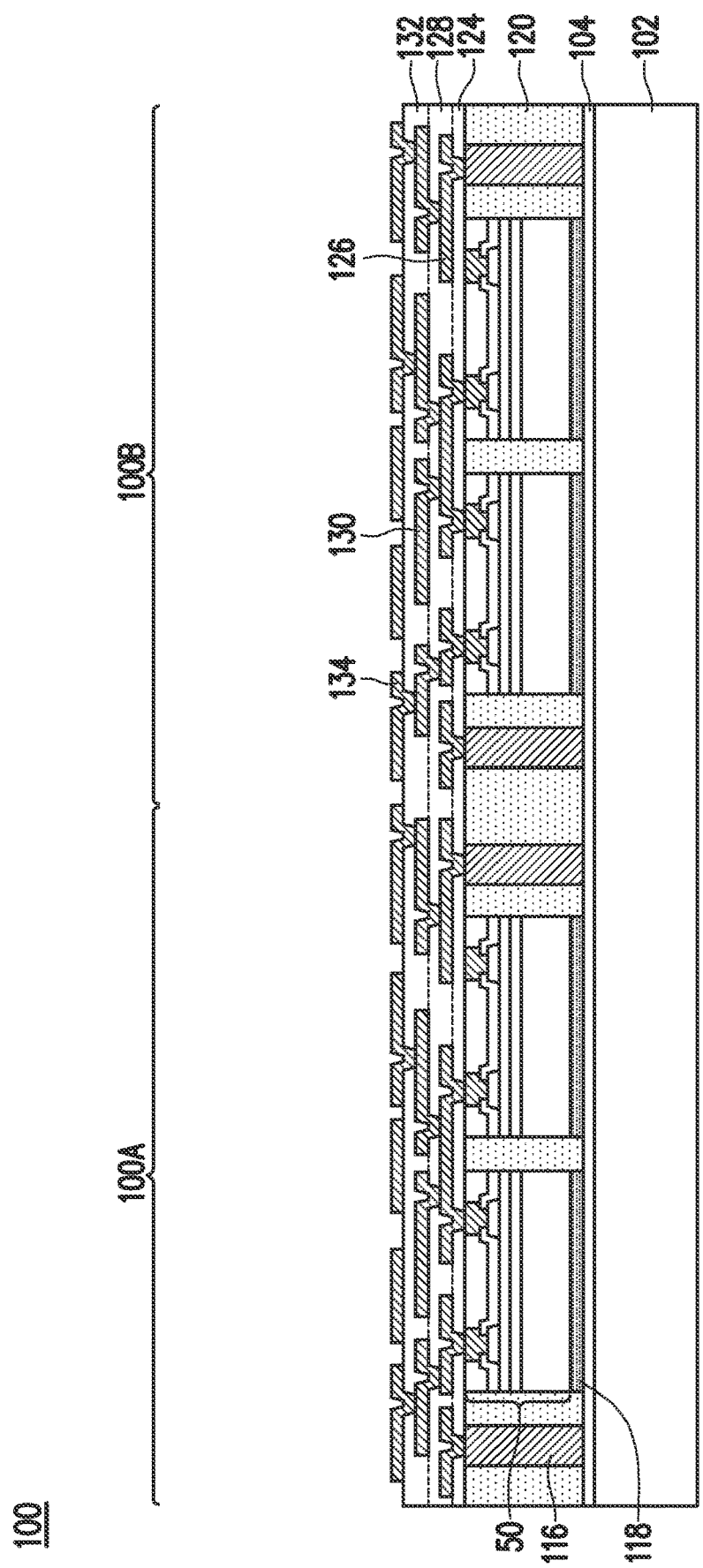

In FIG. 9, the dielectric layer 132 is deposited on the metallization pattern 130 and the dielectric layer 128. The dielectric layer 132 may be formed in a manner similar to the dielectric layer 124, and may be formed of a similar material as the dielectric layer 124.

The metallization pattern 134 is then formed. The metallization pattern 134 includes portions on and extending along the major surface of the dielectric layer 132. The metallization pattern 134 further includes portions extending through the dielectric layer 132 to physically and electrically couple the metallization pattern 130. The metallization pattern 134 may be formed in a similar manner and of a similar material as the metallization pattern 126. The metallization pattern 134 is the topmost metallization pattern of the front-side redistribution structure 122. As such, all of the intermediate metallization patterns of the front-side redistribution structure 122 (e.g., the metallization patterns 126 and 130) are disposed between the metallization pattern 134 and the integrated circuit dies 50. In some embodiments, the metallization pattern 134 has a different size than the metallization patterns 126 and 130. For example, the conductive lines and/or vias of the metallization pattern 134 may be wider or thicker than the conductive lines and/or vias of the metallization patterns 126 and 130. Further, the metallization pattern 134 may be formed to a greater pitch than the metallization pattern 130.

Figure 10:
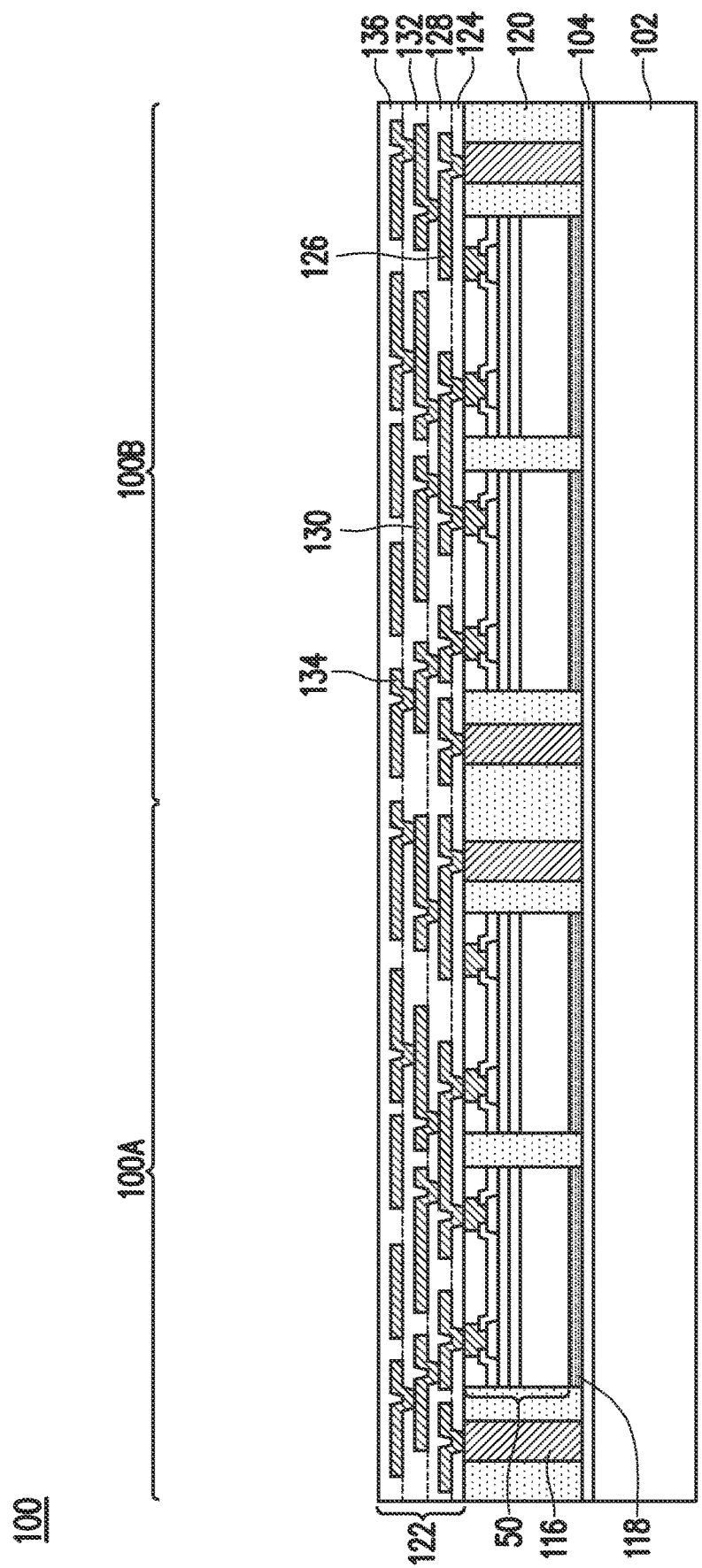

In FIG. 10, the dielectric layer 136 is deposited on the metallization pattern 134 and the dielectric layer 132. The dielectric layer 136 may be formed in a manner similar to the dielectric layer 124, and may be formed of the same material as the dielectric layer 124. The dielectric layer 136 is the topmost dielectric layer of the front-side redistribution structure 122. As such, all of the metallization patterns of the front-side redistribution structure 122 (e.g., the metallization patterns 126, 130, and 134) are disposed between the dielectric layer 136 and the integrated circuit dies 50. Further, all of the intermediate dielectric layers of the front-side redistribution structure 122 (e.g., the dielectric layers 124, 128, 132) are disposed between the dielectric layer 136 and the integrated circuit dies 50.

Figure 11:
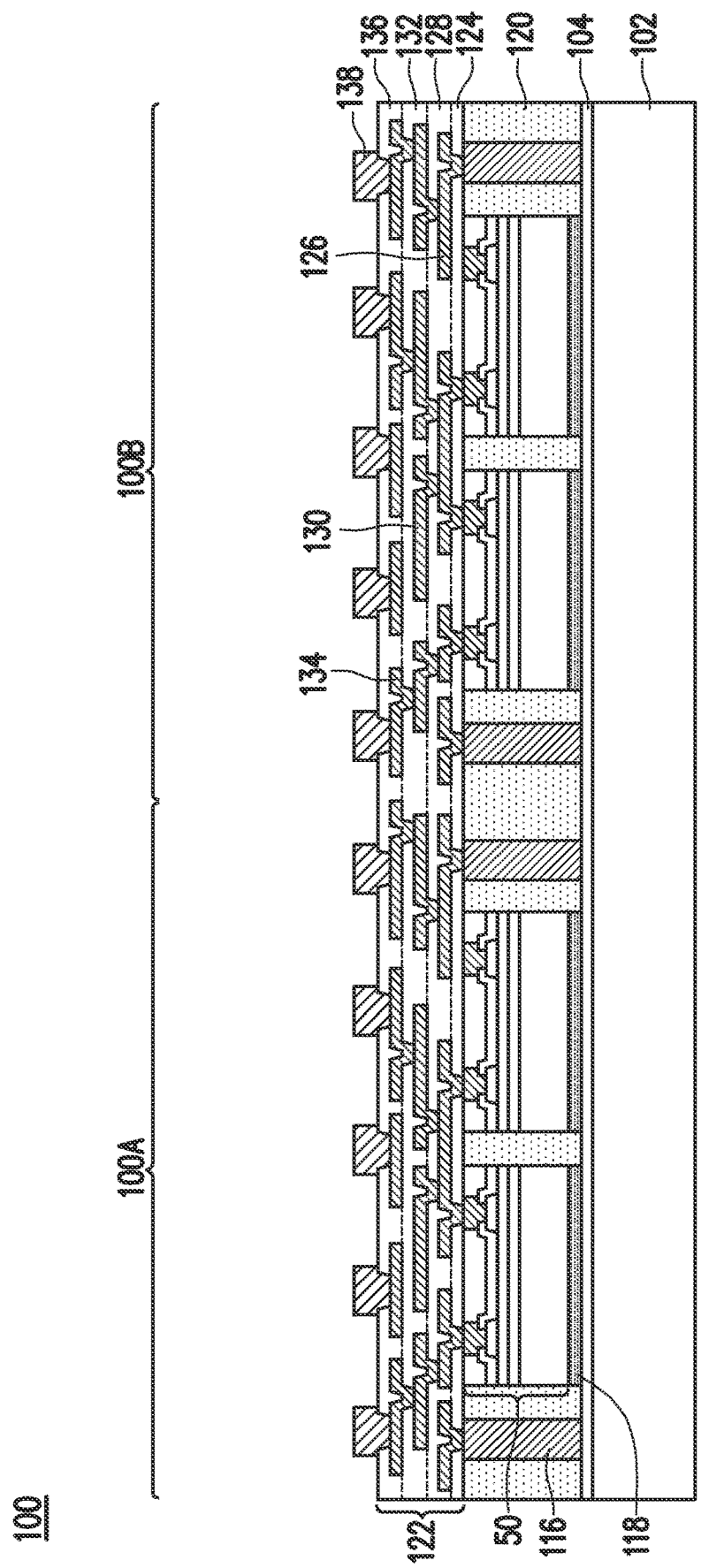
FIG. 11 illustrates placement of underbump metallizations, in accordance with an embodiment.

In FIG. 11, under bump metallizations (UBMs) 138 are formed for external connection to the front-side redistribution structure 122. The UBMs 138 have bump portions on and extending along the major surface of the dielectric layer 136, and have via portions extending through the dielectric layer 136 to physically and electrically couple the metallization pattern 134. As a result, the UBMs 138 are electrically coupled to the through vias 116 and the integrated circuit dies 50. The UBMs 138 may be formed of the same material as the metallization pattern 126. In some embodiments, the UBMs 138 have a different size than the metallization patterns 126, 130, and 134.

Figure 12:
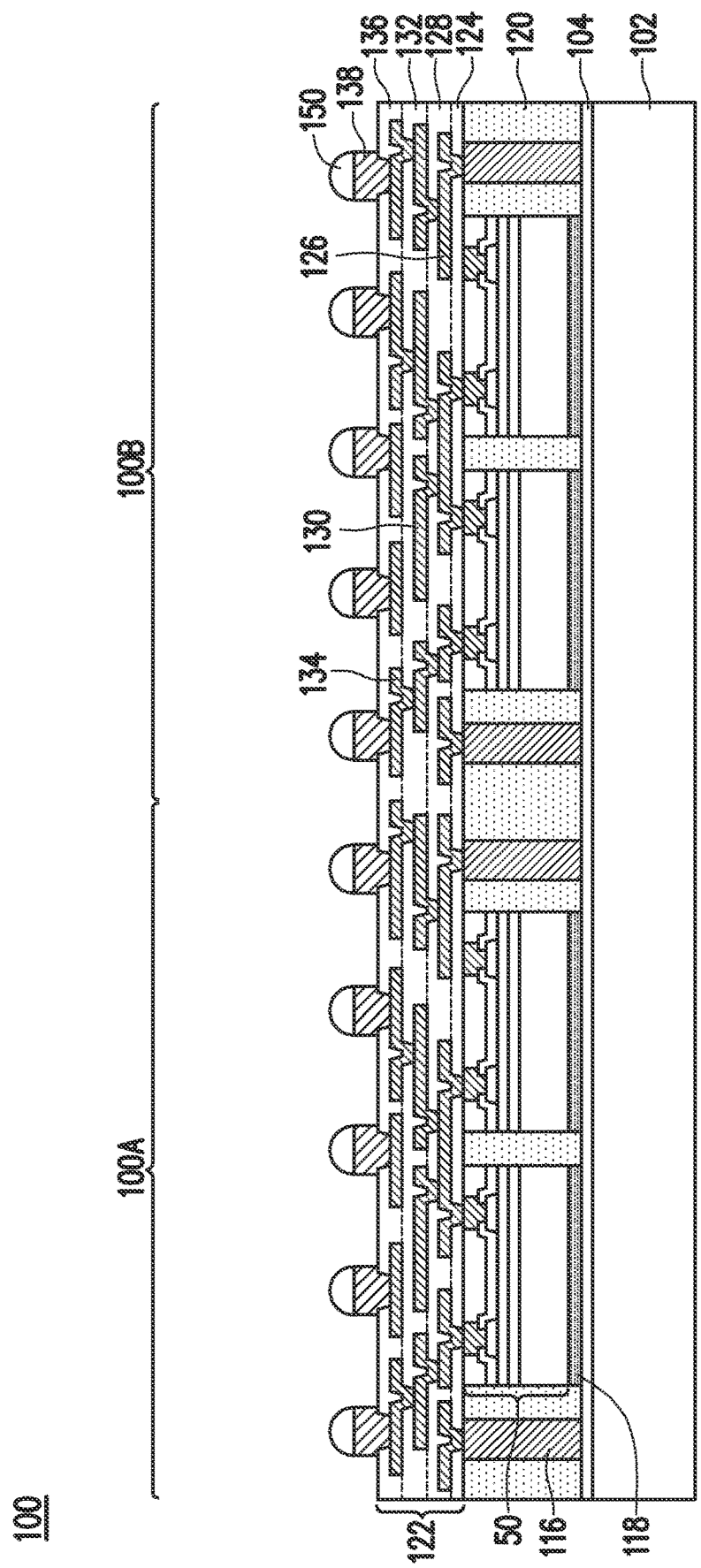
FIG. 12 illustrates formation of conductive connectors, in accordance with an embodiment.

In FIG. 12, conductive connectors 150 are formed on the UBMs 138. The conductive connectors 150 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 150 may include a conductive material such as solder, copper, aluminum, gold, nickel, silver, palladium, tin, the like, or a combination thereof. In some embodiments, the conductive connectors 150 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 150 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 13:
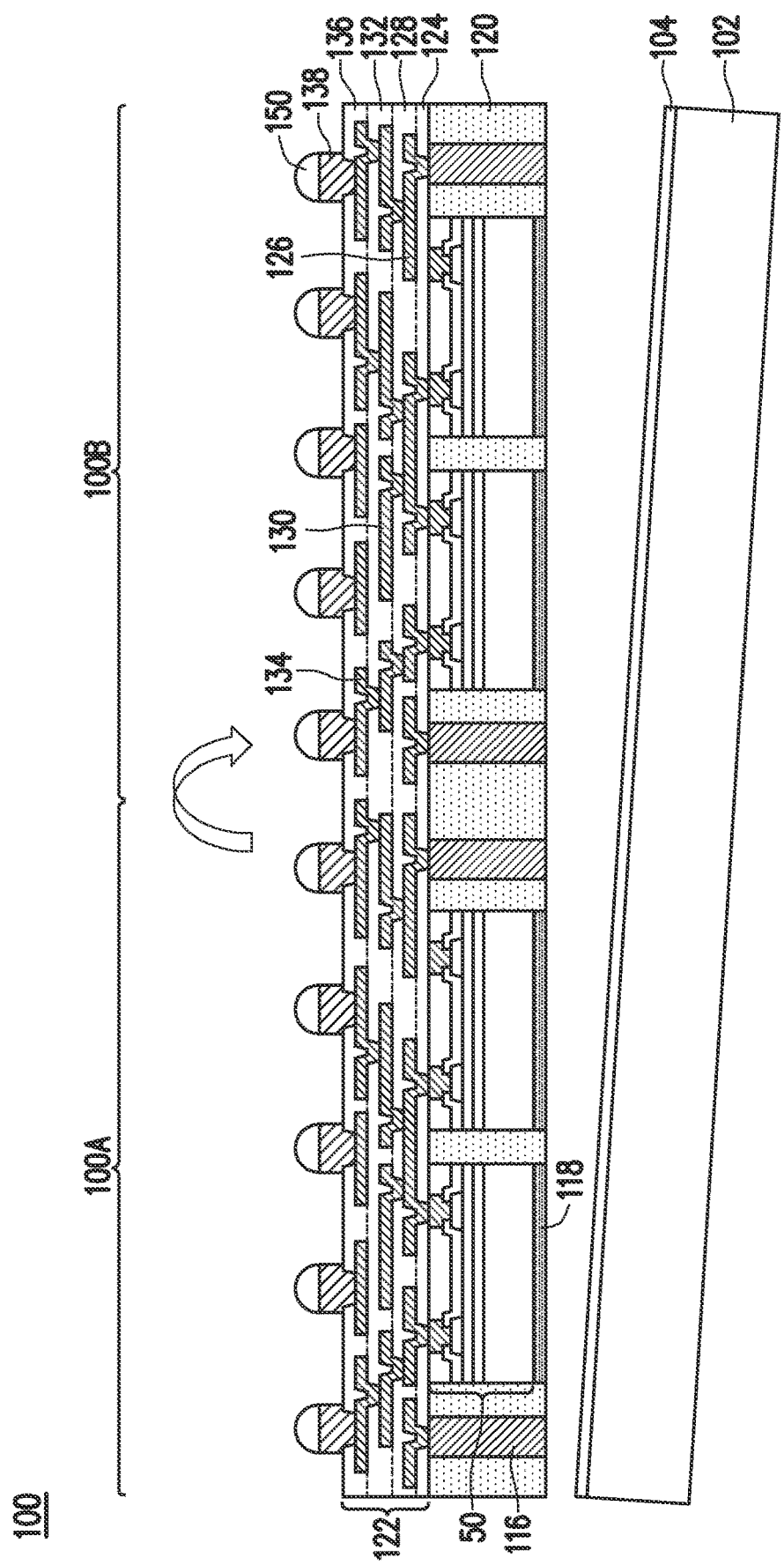
FIG. 13 illustrates removal of the carrier substrate, in accordance with an embodiment.

In FIG. 13, a carrier substrate de-bonding is performed to detach (or "de-bond") the carrier substrate 102. In accordance with some embodiments, the de-bonding includes projecting a light such as a laser light or an UV light on the release layer 104 so that the release layer 104 decomposes under the heat of the light and the carrier substrate 102 and release layer 104 can be removed. The structure is then flipped over and placed on a tape (not shown).

Figure 14A:
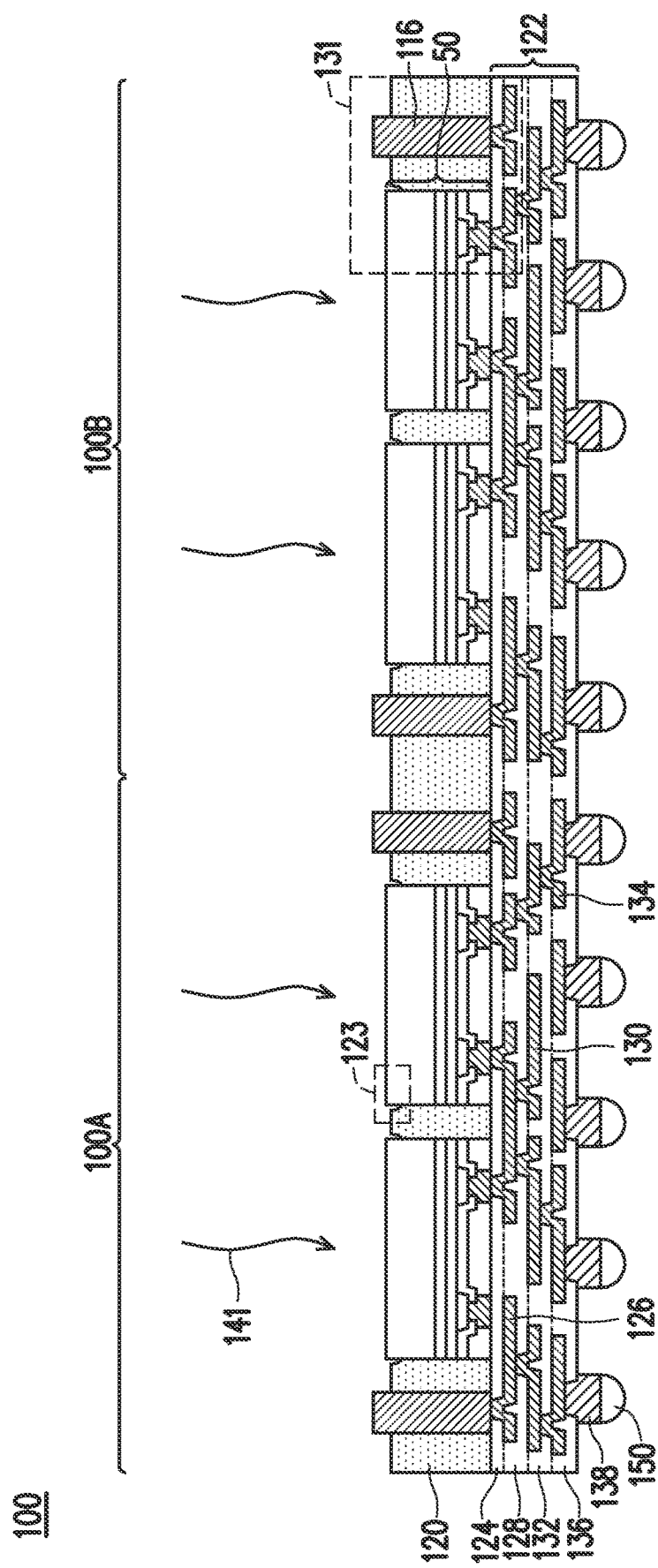

In FIG. 14A, a cleaning process (represented in FIG. 14A by the wavy lines labeled 141) is performed in order to ensure that any remaining portions of the release layer 104 are fully removed and the adhesive 118 is removed. In an embodiment the cleaning process 141 may be performed using a plasma cleaning process, a wet etching process, combinations of these, or the like. However, any suitable cleaning may be performed.

Once the release layer 104 has been fully removed, the adhesive 118 is removed in order to expose a back surface of the integrated circuit dies 50, thereby removing material which may otherwise restrict the heat dissipation efficiency. In an embodiment the adhesive 118 can be removed using either a dry etching process (e.g., a plasma etching process) or a wet etching process. In an embodiment in which a wet etching process is utilized, a solvent or etchant such as dimethyl sulfoxide (DMSO), TMAH, combinations of these, or the like, is applied to the adhesive 118. Once in physical contact, the solvent or etchant is utilized to either physically or chemically remove the material of the adhesive 118. However, any suitable process to remove the adhesive 118 may be utilized.

Additionally, the encapsulant 120 may be recessed in order to expose sidewalls of the through vias 116. In an embodiment the encapsulant 120 may be recessed by one or more of the cleaning process 141 or the process utilized to remove the adhesive 118. In another embodiment the encapsulant 120 may be recessed in a separate etching process, such as a wet etch or dry etching process.

FIG. 14B illustrates a close up view of the dashed line labeled 123 in FIG. 14A. As can be seen in FIG. 14B, by removing the adhesive 118, the extensions 121 of the adhesive 118 are also removed. As such, first recesses 125 are formed in the location and shape of the extensions 121 of the adhesive 118, and the first recesses 125 will have a similar shape and size (e.g., the first height $H_1$ and the first distance $D_1$) as the extensions 121 of the adhesive 118. However, any suitable size and shape may be utilized.

Figure 14C:
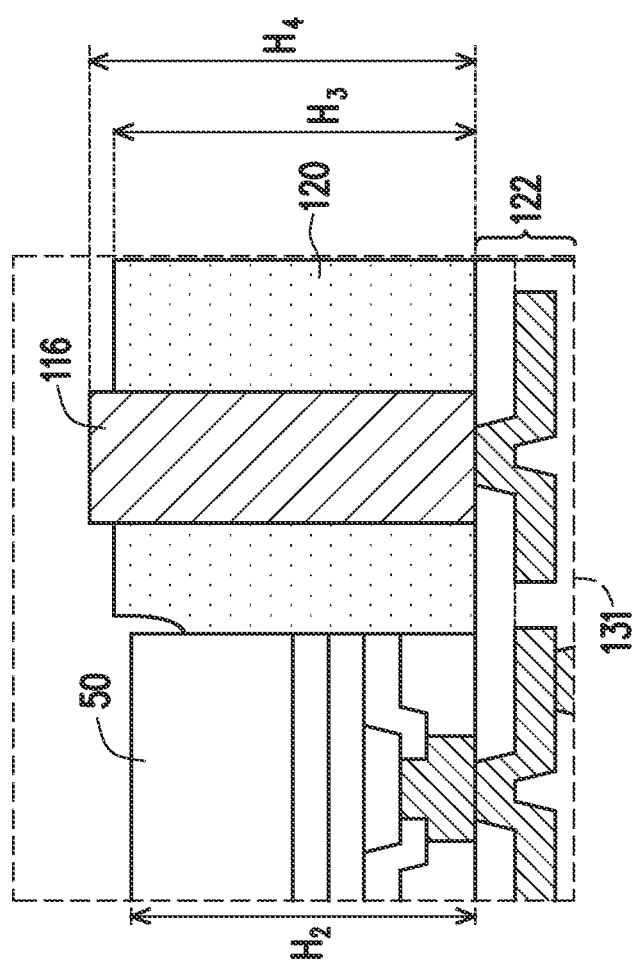

FIG. 14C illustrates a close up view of the dashed line labeled 131 in FIG. 14A. As can be seen in FIG. 14C, after the cleaning process 141 to remove the release layer 104 and the removal of the adhesive 118, each of the integrated circuit dies 50, the encapsulant 120, and the through vias 116 may have different heights extending away from the front-side redistribution structure 122. For example, the integrated circuit dies 50 may have a second height $H_2$ of between about 20 μm and about 700 μm; the encapsulant 120 may have a third height $H_3$ greater than the second height $H_2$, such as having a third height $H_3$ of between about 25 μm and about 705 μm; and the through vias 116 may have a fourth height $H_4$ greater than the third height $H_3$, such as having a fourth height $H_4$ of between about 30 μm and about 710 μm. However, any suitable dimensions may be utilized.

Figure 15:
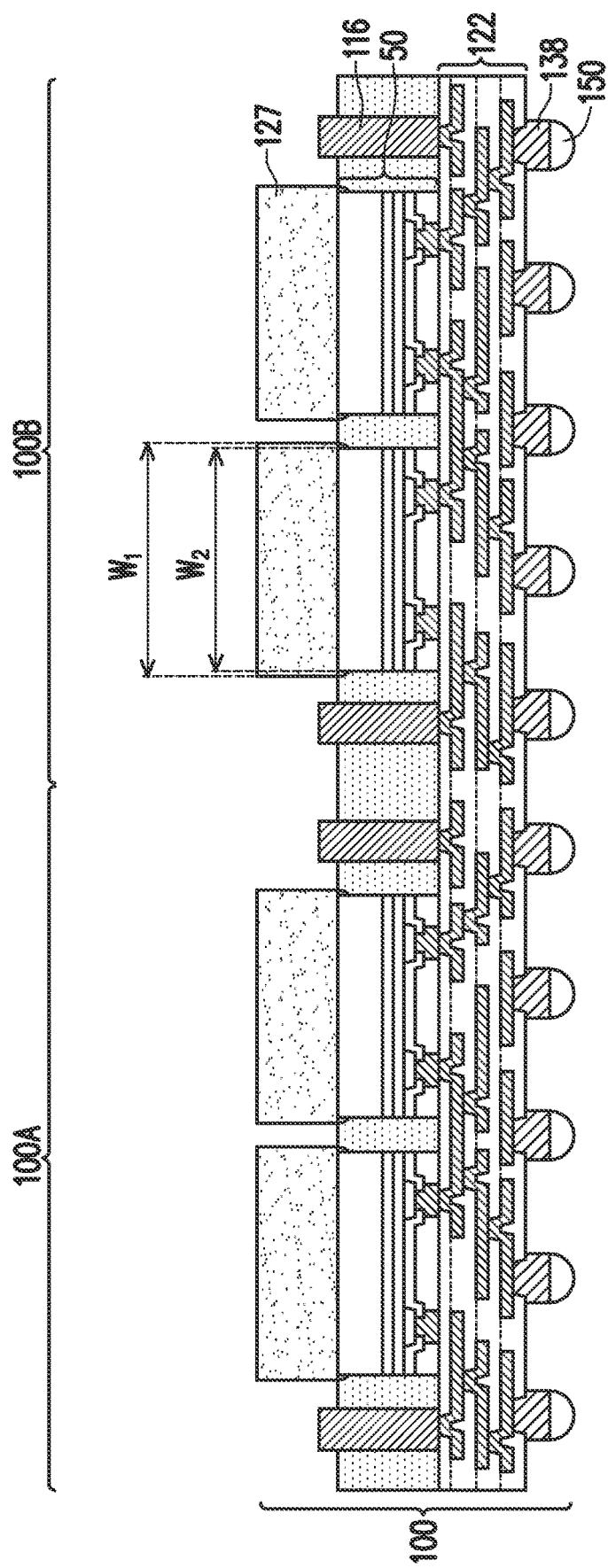
FIG. 15 illustrates placement of an interface material, in accordance with an embodiment.

FIG. 15 illustrates a placement of an interface material 127 over the integrated circuit dies 50 but not over the through vias 116, thereby connecting the integrated circuit dies 50 with overlying structures (not illustrated in FIG. 15 but illustrated and described below). In an embodiment the interface material 127 can be a pre-formed film which is highly compressible, has a high adhesion, and has a high thermal conductivity. For example, in some embodiments the pre-formed film can have a thermal conductivity of between about 15 W/k*m and about 60 W/K*m, such as greater than about 20 W/K*m, a stiffness of between about 250 N/mm and about 2500 N/mm, a tackiness of between about 0.5 N*mm and about 10 N*mm, and a tensile strength of between about 0.01 MPa and about 5.0 MPa. However, any suitable parameters may be utilized.

In a particular embodiment the interface material 127 is a material such as lead-tin based solder (PbSn), lead-free solder, indium, carbon composite materials, graphite, carbon nanotubes, or other suitable thermally conductive materials. As a film, the interface material 127 may be placed using a lamination process, a pick and place process, combinations of these, or the like, to an initial thickness of between about 40 μm and about 300 μm, and without the use of an adhesive material (e.g., a die attach material or a polymer buffer layer) along a backside of the integrated circuit dies 50. However, any suitable placement and any suitable thickness may be utilized.

Additionally, as illustrated in FIG. 15, the interface material 127 may have a first width $W_1$ that is larger than a second width $W_2$ of the integrated circuit dies 50. As such, in this embodiment the interface material 127 extends over and covers the first recesses 125. For example, in an embodiment in which the integrated circuit dies 50 have the second width $W_2$ of between about 2 mm and about 55 mm, the interface material 127 has the first width $W_1$ of between about 2.5 mm and about 55.5 mm. However, any suitable dimensions may be utilized.

Figure 16:
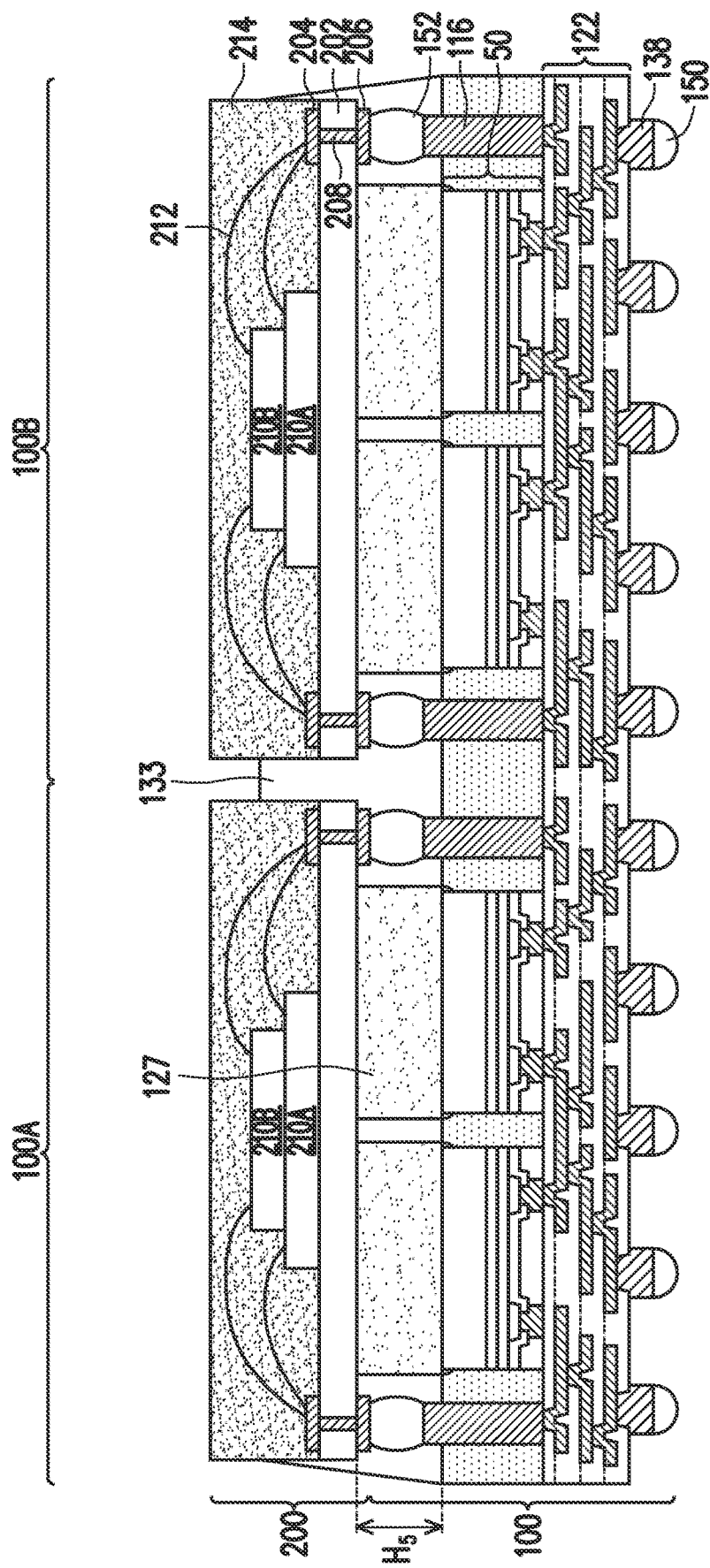
FIG. 16 illustrates placement of a package, in accordance with an embodiment.

FIG. 16 illustrates formation of conductive connectors 152 to contact the through vias 116. In some embodiments, the conductive connectors 152 comprise flux and are formed in a flux dipping process. In some embodiments, the conductive connectors 152 comprise a conductive paste such as solder paste, silver paste, or the like, and are dispensed in a printing process. In some embodiments, the conductive connectors 152 are formed in a manner similar to the conductive connectors 150, and may be formed of a similar material as the conductive connectors 150. Additionally, in some embodiments an intermetal compound (IMC) may form during formation of the conductive connectors 152.

FIG. 16 additionally illustrates formation and implementation of device stacks, in accordance with some embodiments. The device stacks are formed from the integrated circuit packages formed in the first package component 100. The device stacks may also be referred to as package-on-package (PoP) structures. In FIG. 16, second package components 200 are coupled to the first package component 100. One of the second package components 200 is coupled in each of the package regions 100A and 100B to form an integrated circuit device stack in each region of the first package component 100.

The second package components 200 include, for example, a substrate 202 and one or more stacked dies 210 (e.g., 210A and 210B) coupled to the substrate 202. Although one set of stacked dies 210 (210A and 210B) is illustrated, in other embodiments, a plurality of stacked dies 210 (each having one or more stacked dies) may be disposed side-by-side coupled to a same surface of the substrate 202. The substrate 202 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 202 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate 202.

The substrate 202 may include active and passive devices (not shown). A wide variety of devices such as transistors, capacitors, resistors, combinations of these, and the like may be used to generate the structural and functional requirements of the design for the second package components 200. The devices may be formed using any suitable methods.

The substrate 202 may also include metallization layers (not shown) and the conductive vias 208. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate 202 is substantially free of active and passive devices.

The substrate 202 may have bond pads 204 on a first side of the substrate 202 to couple to the stacked dies 210, and bond pads 206 on a second side of the substrate 202, the second side being opposite the first side of the substrate 202, to couple to the conductive connectors 152. In some embodiments, the bond pads 204 and 206 are formed by forming recesses (not shown) into dielectric layers (not shown) on the first and second sides of the substrate 202. The recesses may be formed to allow the bond pads 204 and 206 to be embedded into the dielectric layers. In other embodiments, the recesses are omitted as the bond pads 204 and 206 may be formed on the dielectric layer. In some embodiments, the bond pads 204 and 206 include a thin seed layer (not shown) made of copper, titanium, nickel, gold, palladium, the like, or a combination thereof. The conductive material of the bond pads 204 and 206 may be deposited over the thin seed layer. The conductive material may be formed by an electrochemical plating process, an electroless plating process, CVD, atomic layer deposition (ALD), PVD, the like, or a combination thereof. In an embodiment, the conductive material of the bond pads 204 and 206 is copper, tungsten, aluminum, silver, gold, the like, or a combination thereof.

In some embodiments, the bond pads 204 and the bond pads 206 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 204 and 206. Any suitable materials or layers of material that may be used for the bond pads 204 and 206 are fully intended to be included within the scope of the current application. In some embodiments, the conductive vias 208 extend through the substrate 202 and couple at least one of the bond pads 204 to at least one of the bond pads 206.

In the illustrated embodiment, the stacked dies 210 are coupled to the substrate 202 by wire bonds 212, although other connections may be used, such as conductive bumps. In an embodiment, the stacked dies 210 are stacked memory dies. For example, the stacked dies 210 may be memory dies such as low-power (LP) double data rate (DDR) memory modules, such as LPDDR1, LPDDR2, LPDDR3, LPDDR4, or the like memory modules.

The stacked dies 210 and the wire bonds 212 may be encapsulated by a molding material 214. The molding material 214 may be molded on the stacked dies 210 and the wire bonds 212, for example, using compression molding. In some embodiments, the molding material 214 is a molding compound, a polymer, an epoxy, silicon oxide filler material, the like, or a combination thereof. A curing process may be performed to cure the molding material 214; the curing process may be a thermal curing, a UV curing, the like, or a combination thereof.

In some embodiments, the stacked dies 210 and the wire bonds 212 are buried in the molding material 214, and after the curing of the molding material 214, a planarization step, such as a grinding, is performed to remove excess portions of the molding material 214 and provide a substantially planar surface for the second package components 200.

After the second package components 200 are formed, the second package components 200 are mechanically and electrically bonded to the first package component 100 by way of the conductive connectors 152, the bond pads 206, and a metallization pattern of the back-side redistribution structure. In some embodiments, the stacked dies 210 may be coupled to the integrated circuit dies 50A and 50B through the wire bonds 212, the bond pads 204 and 206, the conductive vias 208, the conductive connectors 152, the back-side redistribution structure, the through vias 116, and the front-side redistribution structure 122.

In some embodiments, a solder resist (not shown) is formed on the side of the substrate 202 opposing the stacked dies 210. The conductive connectors 152 may be disposed in openings in the solder resist to be electrically and mechanically coupled to conductive features (e.g., the bond pads 206) in the substrate 202. The solder resist may be used to protect areas of the substrate 202 from external damage.

In some embodiments, the conductive connectors 152 have an epoxy flux (not shown) formed thereon before they are reflowed with at least some of the epoxy portion of the epoxy flux remaining after the second package components 200 are attached to the first package component 100.

After bonding of the second package components 200 to the first package component 100, the interface material 127 is compressed from its initial deposition thickness. In some embodiments, after the bonding the interface material 127 has been compressed to have a fifth height $H_5$ of between about 20 µm and about 200 µm. As such, the interface material 127 may be compressed at least 5 µm. Additionally, a combination of the thickness of the interface material 127 (e.g., the fifth height $H_5$) and the thickness of the integrated circuit dies 50 (e.g., the second height $H_2$) is greater than the thickness of the encapsulant 120 (e.g., the third height $H_3$) by between about 0.5 µm and about 50 µm. However, any suitable thicknesses may be utilized.

Additionally, even though the interface material 127 will be compressed to have the fifth height $H_5$, the interface material 127 will still maintain its sidewalls after the compression. In particular, the interface material 127 will have sharp, vertical (or nearly vertical) sidewalls.

By utilizing the interface material 127 with such a compressibility, problems with poor bump joint performance can be mitigated. In particular, by using a compressible interface material 127, the interface material 127 does not impede the placement and bonding of the conductive connectors 152. As such, fewer defects will occur.

In some embodiments, an underfill 133 is formed between the first package component 100 and the second package components 200, surrounding the conductive connectors 152. The underfill 133 may reduce stress and protect the joints resulting from the reflowing of the conductive connectors 152. The underfill 133 may be formed by a capillary flow process after the second package components 200 are attached, or may be formed by a suitable deposition method before the second package components 200 are attached.

Additionally, in some embodiments the underfill 133 will additionally fill the first recesses 125 that are formed by the removal of the extensions 121 of the adhesive 118. For example, a portion of the first recesses 125 may be exposed after placement of the interface material 127 (for example, in a view that is not seen in FIG. 16), and the underfill 133 will flow into the first recesses 125 during placement of the underfill 133.

Figure 17:
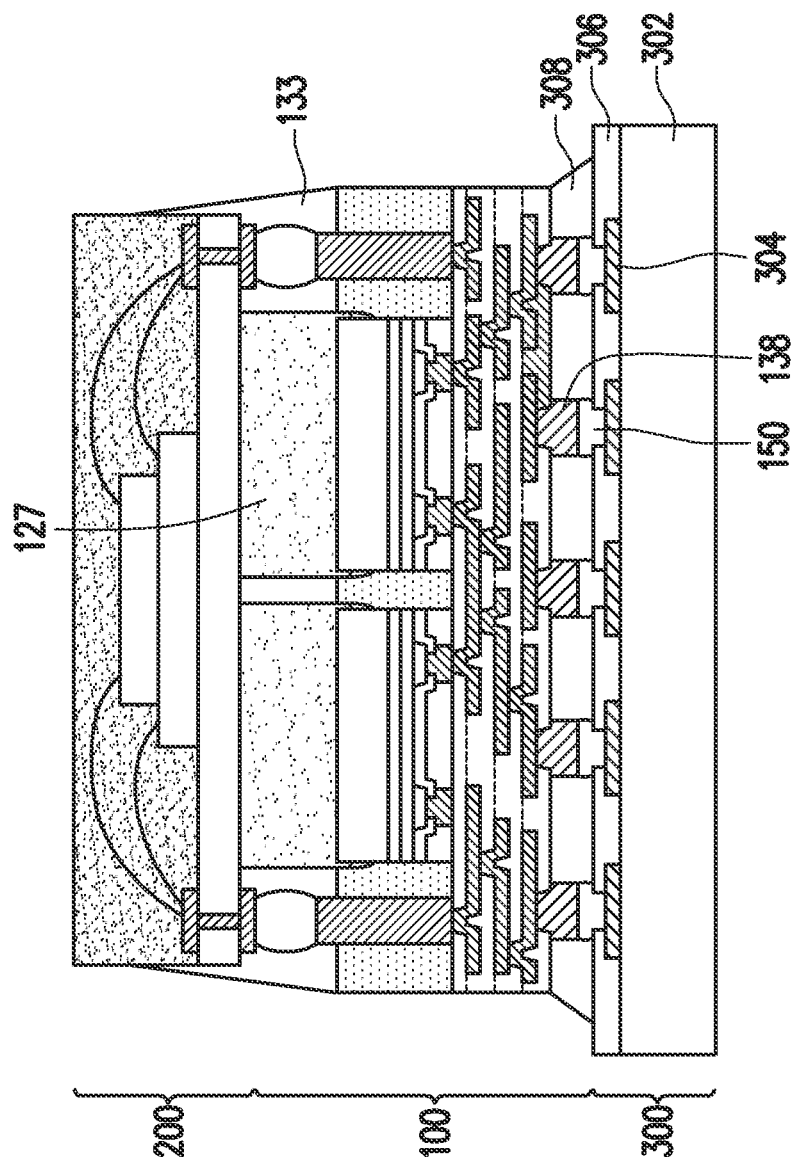
FIG. 17 illustrates a singulation, in accordance with an embodiment.

In FIG. 17, a singulation process is performed by sawing along scribe line regions, e.g., between the first package region 100A and the second package region 100B. The sawing singulates the first package region 100A from the second package region 100B. The resulting, singulated device stack is from one of the first package region 100A or the second package region 100B. In some embodiments, the singulation process is performed after the second package components 200 are coupled to the first package component 100. In other embodiments (not shown), the singulation process is performed before the second package components 200 are coupled to the first package component 100, such as after the carrier substrate 102 is de-bonded and the conductive connectors 152 are formed.

Each singulated first package component 100 may then be mounted to a package substrate 300 using the conductive connectors 150. The package substrate 300 includes a substrate core 302 and bond pads 304 over the substrate core 302. The substrate core 302 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 302 may be an SOI substrate. Generally, an SOI substrate includes a layer of a semiconductor material such as epitaxial silicon, germanium, silicon germanium, SOI, SGOI, or combinations thereof. The substrate core 302 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 302.

The substrate core 302 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 302 may also include metallization layers and vias (not shown), with the bond pads 304 being physically and/or electrically coupled to the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate core 302 is substantially free of active and passive devices.

In some embodiments, the conductive connectors 150 are reflowed to attach the first package component 100 to the bond pads 304. The conductive connectors 150 electrically and/or physically couple the package substrate 300, including metallization layers in the substrate core 302, to the first package component 100. In some embodiments, a solder resist 306 is formed on the substrate core 302. The conductive connectors 150 may be disposed in openings in the solder resist 306 to be electrically and mechanically coupled to the bond pads 304. The solder resist 306 may be used to protect areas of the substrate 202 from external damage.

The conductive connectors 150 may have an epoxy flux (not shown) formed thereon before they are reflowed with at least some of the epoxy portion of the epoxy flux remaining after the first package component 100 is attached to the package substrate 300. This remaining epoxy portion may act as an underfill to reduce stress and protect the joints resulting from reflowing the conductive connectors 150. In some embodiments, an underfill 308 may be formed between the first package component 100 and the package substrate 300 and surrounding the conductive connectors 150. The underfill 308 may be formed by a capillary flow process after the first package component 100 is attached or may be formed by a suitable deposition method before the first package component 100 is attached.

In some embodiments, passive devices (e.g., surface mount devices (SMDs), not shown) may also be attached to the first package component 100 (e.g., to the UBMs 138) or to the package substrate 300 (e.g., to the bond pads 304). For example, the passive devices may be bonded to a same surface of the first package component 100 or the package substrate 300 as the conductive connectors 150. The passive devices may be attached to the first package component 100 prior to mounting the first package component 100 on the package substrate 300, or may be attached to the package substrate 300 prior to or after mounting the first package component 100 on the package substrate 300.

The first package component 100 may be implemented in other device stacks. For example, a PoP structure is shown, but the first package component 100 may also be implemented in a Flip Chip Ball Grid Array (FCBGA) package. In such embodiments, the first package component 100 is mounted to a substrate such as the package substrate 300, but the second package component 200 is omitted. Instead, a lid or heat spreader may be attached to the first package component 100. When the second package component 200 is omitted, the back-side redistribution structure and through vias 116 may also be omitted.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

By utilizing the materials and processes presented herein, the interface material provides for a better overall structure and process. In particular, by using a material with a higher thermal conductivity, more heat can be removed from the dies during operation. Additionally, by using a material with high stiffness and tensile strength, the heat transfer can be achieved without losing structural support for the device.

Figure 18:
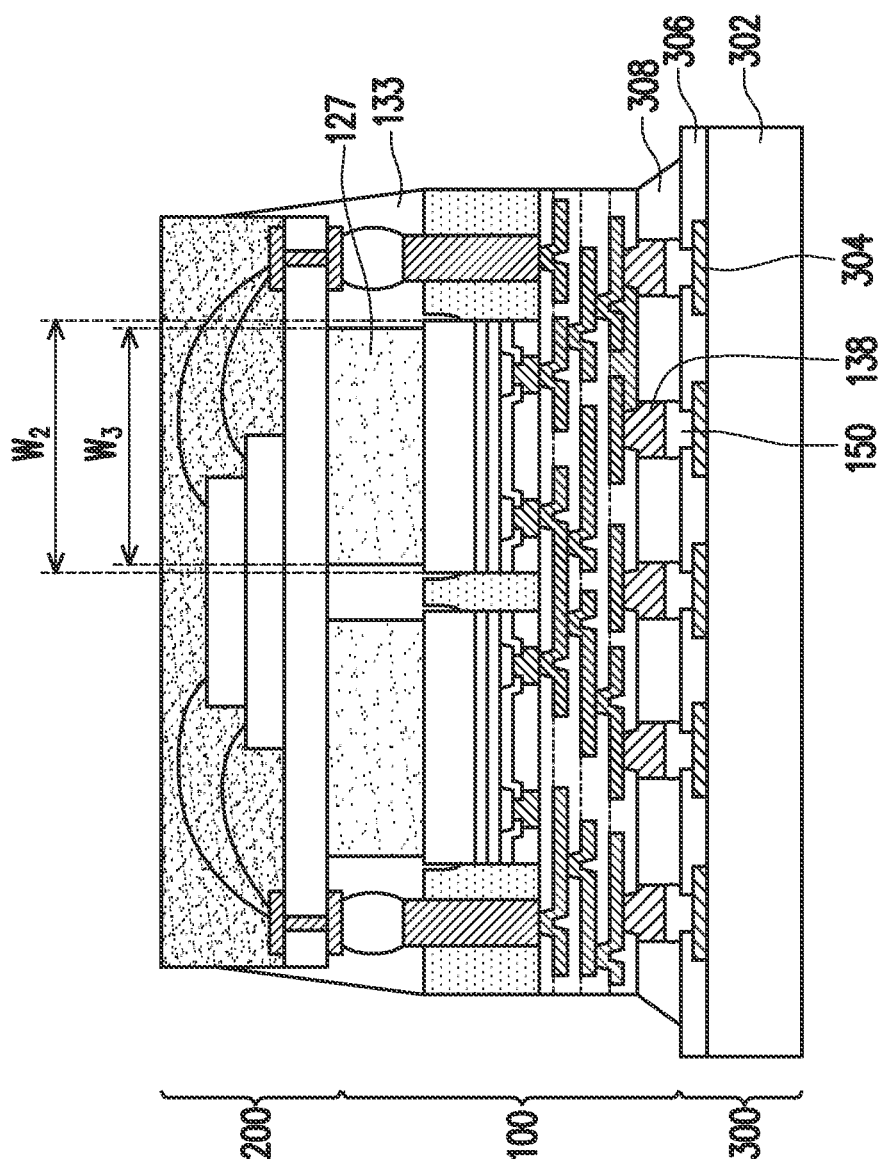
FIG. 18 illustrates an embodiment in which the interface material is smaller than the semiconductor die, in accordance with an embodiment.

FIG. 18 illustrates another embodiment in which the interface material 127 has dimensions that are less than the integrated circuit dies 50. For example, in an embodiment in which the integrated circuit dies 50 have the second width $W_2$, the interface material 127 may be formed and/or placed to have a third width $W_3$ of between about 1.5 µm and about 54.5 µm. However, any suitable dimensions may be utilized.

By forming the interface material 127 smaller than the integrated circuit dies 50, the first recesses 125 are fully exposed and are not covered by the interface material 127. As such, during the dispensing and placement of the underfill 133, the underfill will flow into and fully fill the first recesses 125. Additionally, less material of the interface material 127 is used, leading to less overall costs.

Figure 19:
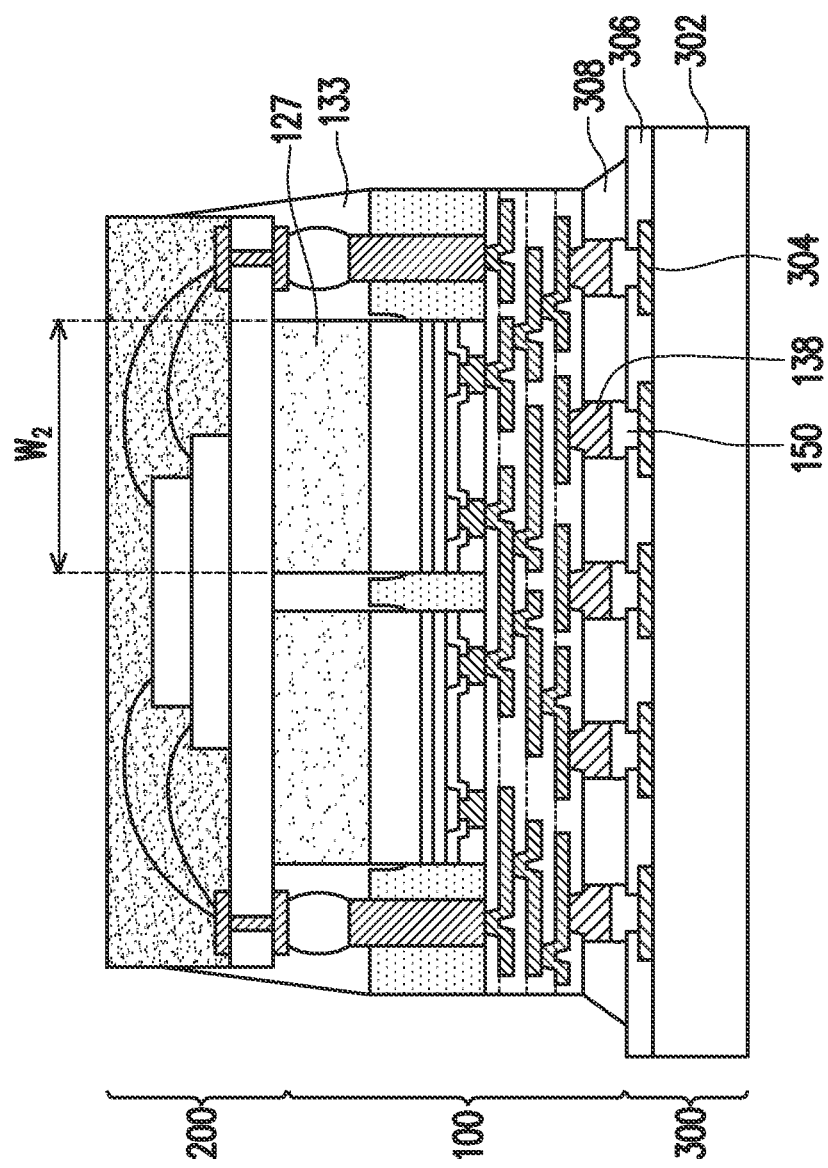
FIG. 19 illustrates an embodiment in which the interface material is equal to the semiconductor die, in accordance with an embodiment.

FIG. 19 illustrates another embodiment in which the interface material 127 has dimensions that are equal to the integrated circuit dies 50. For example, in an embodiment in which the integrated circuit dies 50 have the second width $W_2$, the interface material 127 may be formed and/or placed to have the second width $W_2$ as well. However, any suitable dimensions may be utilized.

By forming the interface material 127 equal to the integrated circuit dies 50, and similar to the embodiment described above with respect to FIG. 18, the first recesses 125 are fully exposed after placement of the interface material 127. As such, the first recesses 125 are ensured to be filled by the underfill 133 during dispensing of the underfill 133. Additionally, less material of the interface material 127 is used, leading to less overall costs.

Figure 20:
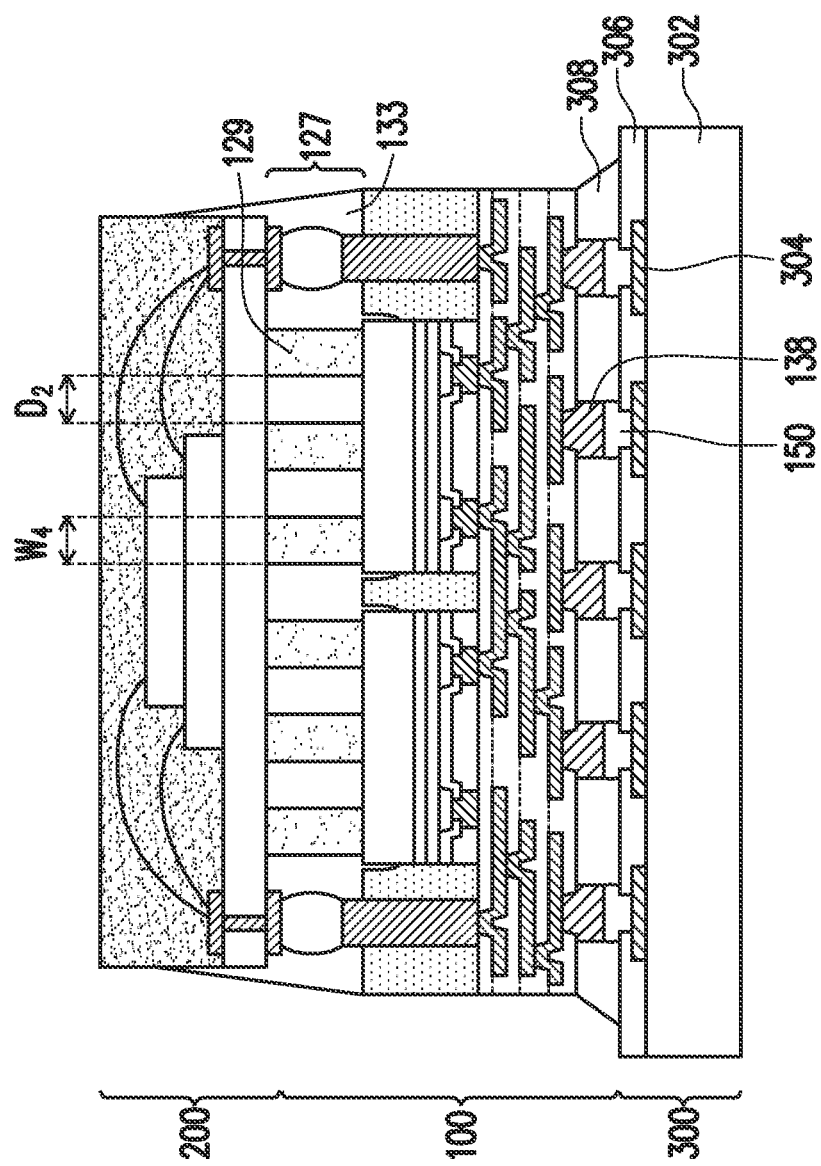
FIG. 20 illustrates an embodiment in which the interface material comprises discontinuous sections, in accordance with an embodiment.

FIG. 20 illustrates yet another embodiment in which the interface material 127, instead of being a single continuous material over each of the integrated circuit dies 50, comprises multiple, discontinuous sections 129 of the interface material 127. In an embodiment the interface material 127 may be separated into two or more sections, such as the three sections illustrated in FIG. 20, wherein each of the sections 129 has a fourth width $W_4$ of between about 0.1 mm and about 55 mm, and may be separated from each other by a second distance $D_2$ of between about 5 μm and about 500 μm. In other embodiments each of the sections 129 have different dimensions from each other. However, any suitable distances and widths may be utilized.

By utilizing the multiple, discontinuous sections 129, particular individual sections of the integrated circuit dies 50 may be targeted. For example, if certain sections of the integrated circuit dies 50 are known to be hot spots relative to a remainder of the integrated circuit die 50, then the multiple, discontinuous sections 129 can be placed over the hot spots in order to provide a better path for heat dissipation.

Figure 21:
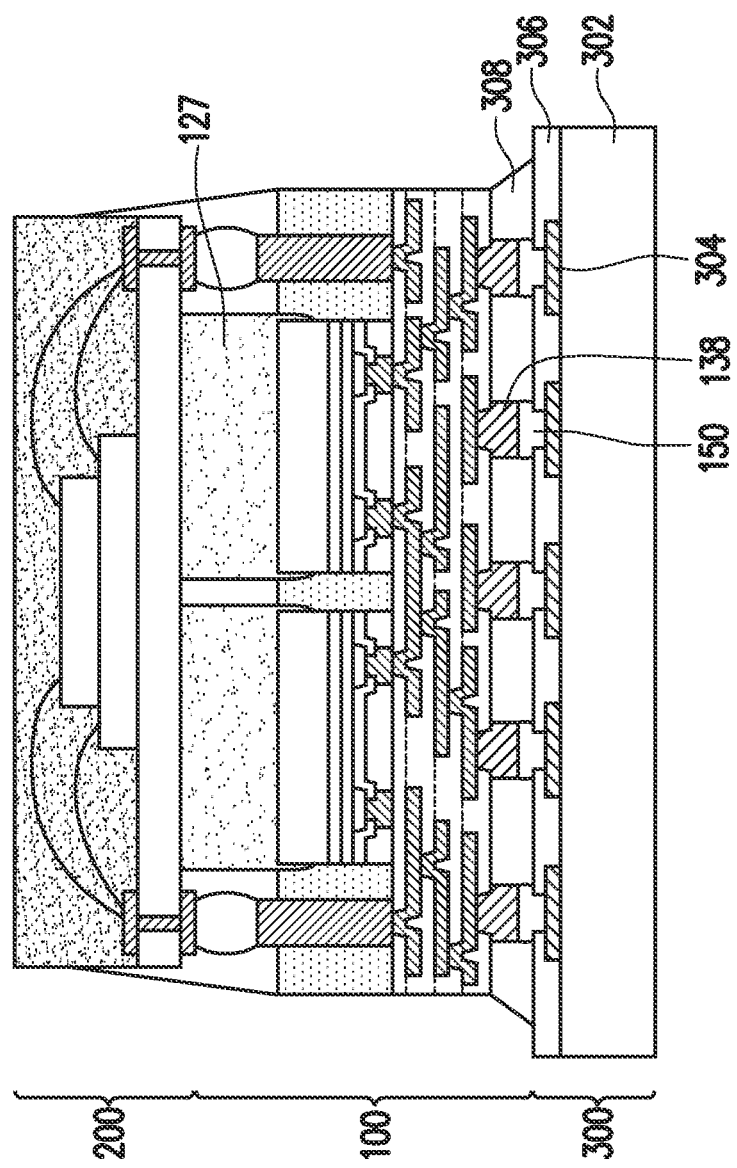
FIG. 21 illustrates an embodiment in which the interface material fills recess, in accordance with an embodiment.

FIG. 21 illustrates yet another embodiment in which the interface material 127 is utilized to actually fill the first recesses 125. In such an embodiment the fluidity of the interface material 127 is raised so that, when the interface material 127 is applied, a portion of the interface material 127 will flow into the first recesses 125 and will surround portions of the semiconductor substrate 52. In an embodiment the fluidity of the interface material 127 may be increased by pressure or temperature. However, any suitable method may be utilized.

FIGS. 22A-22D illustrate another embodiment in which the interface material 127 is utilized within a chip on wafer on substrate (CoWoS) package 2200. Initially looking at FIG. 22A, there is illustrated semiconductor dies 2201 (with an underfill) attached to a first interposer 2203. In an embodiment the semiconductor dies 2201 may be semiconductor devices such as logic dies, DRAM dies, SRAM dies, central processing unit dies, I/O dies, combinations of these, or the like. Additionally, while the semiconductor dies 2201 may be the same type of device (e.g., both be DRAM dies), they may also be different types of dies (e.g., one may be a logic die and another may be a DRAM die such as a high bandwidth memory (HBM) die). The semiconductor dies 2201 may also comprise a stack of multiple dies. Any suitable combination of semiconductor dies, and any number of semiconductor dies, may be utilized, and all such numbers, combinations, and functionalities are fully intended to be included within the scope of the embodiments.

Looking next at the first interposer 2203, the first interposer 2203 may comprise an interposer substrate with through substrate vias (TSVs). In this embodiment the interposer substrate may be, e.g., a silicon substrate, doped or undoped, or an active layer of a silicon-on-insulator (SOI) substrate. However, the interposer substrate may also be a glass substrate, a ceramic substrate, a polymer substrate, or any other substrate that may provide a suitable protection and/or interconnection functionality. These and any other suitable materials may alternatively be used for the interposer substrate.

In some embodiments, the interposer substrate may include electrical elements, such as resistors, capacitors, signal distribution circuitry, combinations of these, or the like. These electrical elements may be active, passive, or a combination thereof. In other embodiments, the interposer substrate is free from both active and passive electrical elements therein. All such combinations are fully intended to be included within the scope of the embodiments.

The semiconductor dies 2201 may be bonded to the first interposer 2203, and an underfill may be placed between them. Additionally, in order to protect the structure, the semiconductor dies 2201 may be encapsulated over the first interposer 2203.

The first interposer 2203 may be bonded to a third substrate 2205 (with, e.g., an underfill between them) to form a chip on wafer on substrate (CoWoS) structure. In an embodiment the third substrate 2205 may be a printed circuit board such as a laminate substrate formed as a stack of multiple thin layers (or laminates) of a polymer material such as bismaleimide triazine (BT), FR-4, ABF, or the like. However, any other suitable substrate, such as a silicon interposer, a silicon substrate, organic substrate, a ceramic substrate, or the like, may alternatively be utilized, and all such redistributive substrates that provide support and connectivity are fully intended to be included within the scope of the embodiments.

Figure 22A:
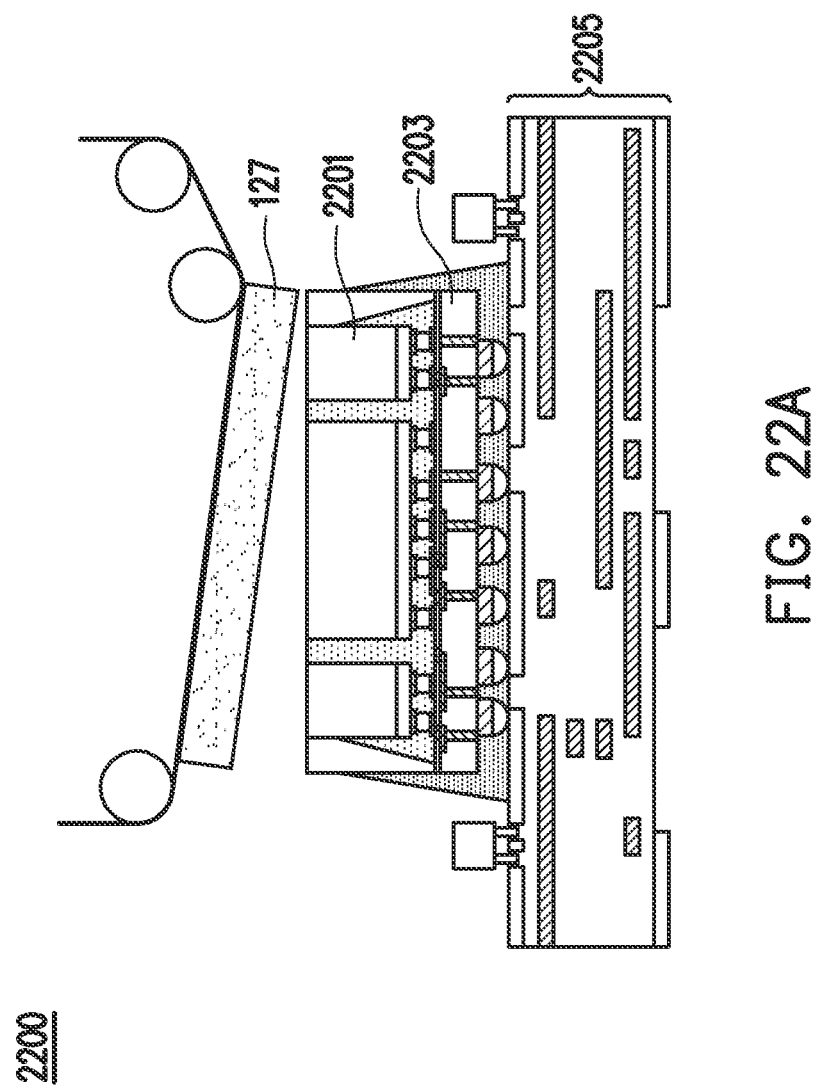
FIGS. 22A-22D illustrate an embodiment in which the interface material is utilized in a chip on wafer on substrate configuration, in accordance with an embodiment.

FIG. 22A additionally illustrates that, once the CoWoS package 2200 has been put together, the interface material 127 may be placed on the semiconductor dies 2201. In an embodiment the interface material 127 may be placed as described above (e.g., using a lamination method) to a first thickness. However, any suitable method of placing the interface material 127 may be utilized.

Figure 22B:
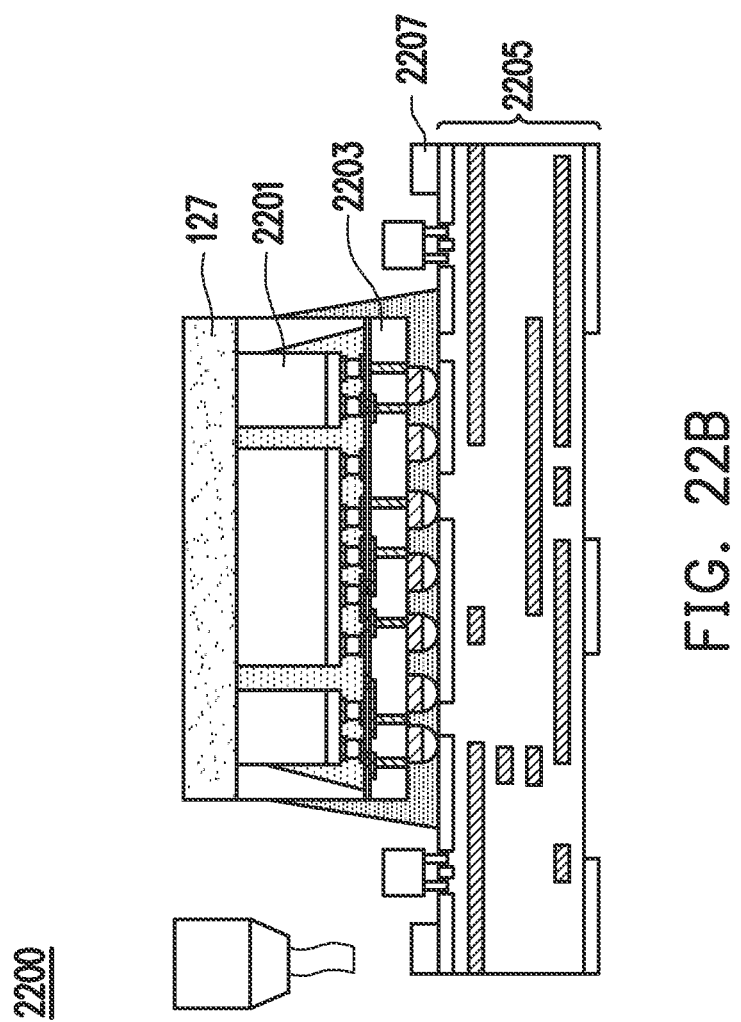

FIG. 22B illustrates a placement of an adhesive 2207 after the interface material 127 has been dispensed. In some embodiments the adhesive 2207 is a metal-based thermal paste containing silver, nickel, or aluminum particles suspended in the silicone grease. In other embodiments non-electrically conductive, ceramic-based pastes, filled with ceramic powders such as beryllium oxide, aluminum nitride, aluminum oxide, or zinc oxide, may be applied. In other embodiments, instead of being a paste with a consistency similar to gels or greases, the adhesive 2207 may, instead be a solid material. In this embodiment the adhesive 2207 may be a thin sheet of a thermally conductive, solid material. In a particular embodiment the adhesive 2207 that is solid may be a thin sheet of indium, nickel, silver, aluminum, combinations and alloys of these, or the like, or other thermally conductive solid material. Any suitably thermally conductive material may also be utilized, and all such materials are fully intended to be included within the scope of the embodiments.

Figure 22C:
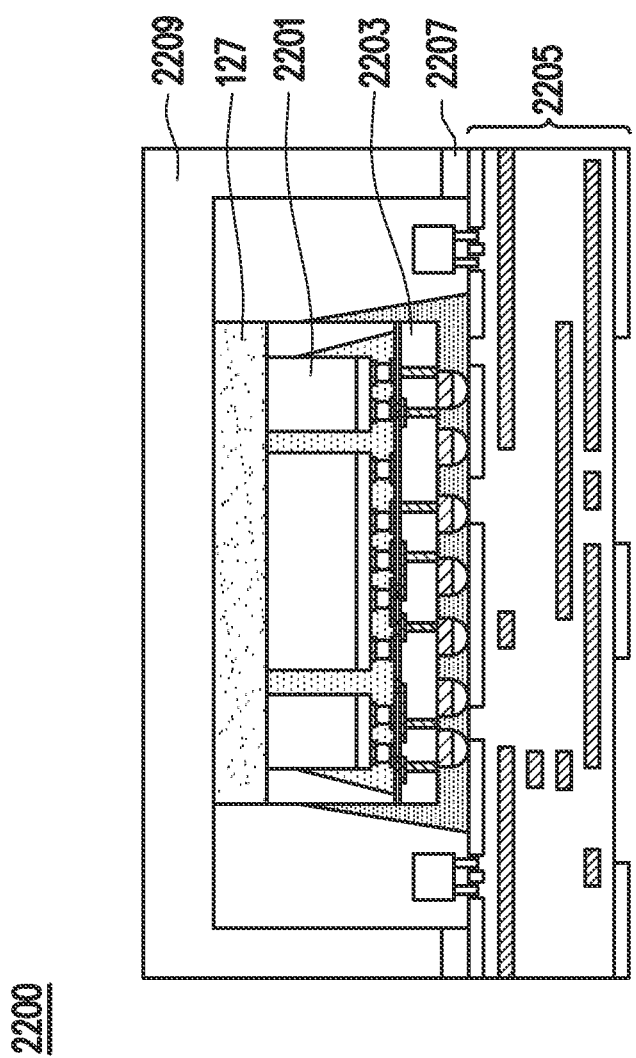

FIG. 22C illustrates a placement of a lid 2209 over the interface material 127 and held in place with the adhesive 2207. In an embodiment the lid 2209 may comprise copper, aluminum, other metals, alloys, combinations thereof, or other material of high electrical and thermal conductivities. In some embodiments the lid 2209 is utilized to help disperse heat generated from the CoWoS structure 2200.

Figure 22D:
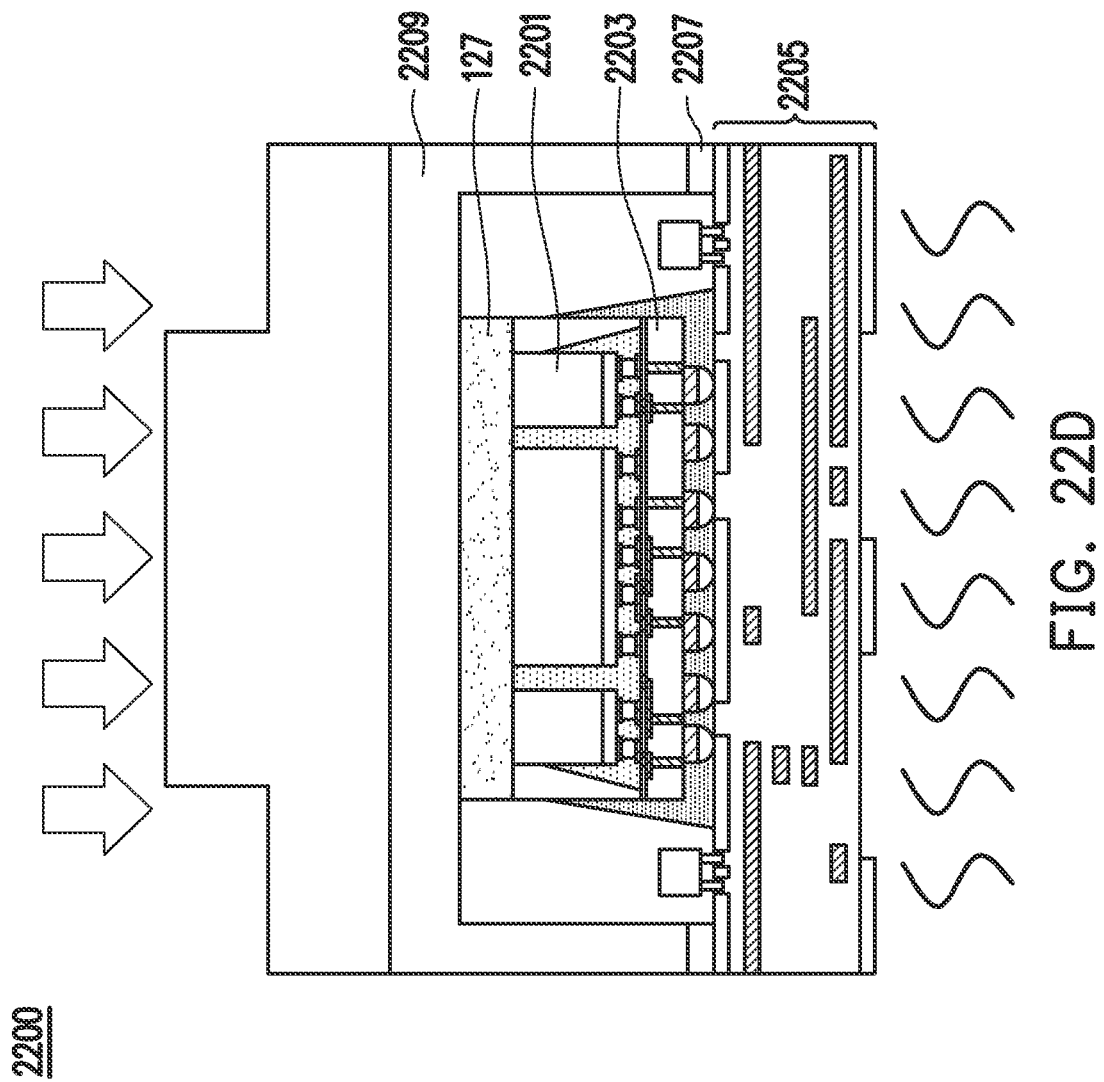

FIG. 22D illustrates that, once the lid 2209 has been placed over the interface material 127, the lid 2209 may be sealed to the CoWoS structure 2200. In one embodiment the lid 2209 may be sealed using a heat clamping method, whereby pressure and heat are applied in order to seal the lid 2209 to the structure. However, any suitable method of sealing the lid 2209 may be utilized.

By utilizing the materials and methods described herein, the thermal material can be used to increase the removal of heat from the semiconductor dies (e.g., along the backside of the integrated fan out package). Additionally, by using the methods and materials described, the increase in removal can be achieved without suffering a decrease in the overall structural integrity of the device. As such, a more efficient and structurally sound device can be achieved.

In an embodiment, a semiconductor device includes: an encapsulant encapsulating a semiconductor die and through vias, wherein the encapsulant has a curved sidewall along a recess which exposes at least a portion of a sidewall of the semiconductor die; an interface material over the semiconductor die; and an underfill material around the interface material. In an embodiment the interface material has a first width and the semiconductor die has a second width smaller than the first width. In an embodiment the interface material has a first width and the semiconductor die has a second width greater than the first width. In an embodiment the interface material has a first width and the semiconductor die has the first width. In an embodiment the interface material fills the recess. In an embodiment the underfill material fills the recess. In an embodiment the interface material has a thermal conductivity of between about 15 W/K*m and about 23 W/K*m, has a stiffness of between about 250 N/mm and about 2500 N/mm, and has a tackiness of between about 0.5 N*mm and about 10 N*mm.

In accordance with another embodiment, a semiconductor device includes: an interface material extending between a first package and a semiconductor die, the first package being electrically connected to the semiconductor die by through vias, the through vias having a height greater than the semiconductor die; an encapsulant surrounding the through vias and the semiconductor die, the encapsulant having a curved surface interfacing with a sidewall of the semiconductor die; and an underfill material surrounding the interface material and extending between the first package and the encapsulant. In an embodiment the underfill is in physical contact with the curved surface. In an embodiment the interface material is in physical contact with the curved surface. In an embodiment the encapsulant has a first thickness and the semiconductor die has a second thickness less than the first thickness. In an embodiment the interface material has a thermal conductivity of between about 15 W/K*m and about 23 W/K*m. In an embodiment the interface material overlies the sidewall of the semiconductor die. In an embodiment the interface material comprises discontinuous sections.

In accordance with yet another embodiment, a method of manufacturing a semiconductor device includes: placing a semiconductor die adjacent to a through via, wherein after the placing the semiconductor die an adhesive covers at least a portion of a sidewall of the semiconductor die; placing an encapsulant between the semiconductor die and the through via and in physical contact with the adhesive; removing the adhesive; placing an interface material over the semiconductor die but not over the through via; placing a package in physical contact with the interface material, wherein the placing the package compresses the interface material; and placing an underfill between the package and the semiconductor die. In an embodiment the method further includes, prior to the placing the semiconductor die, laminating the adhesive to the semiconductor die. In an embodiment the placing the package compresses the interface material by at least 20 μm. In an embodiment the placing the underfill covers the portion of the sidewall of the semiconductor die. In an embodiment the placing the interface material covers the portion of the sidewall of the semiconductor die. In an embodiment the adhesive is removed with a wet etching process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    an encapsulant encapsulating a semiconductor die and through vias, wherein the encapsulant has a curved sidewall, wherein a portion of a sidewall of the semiconductor die adjacent to the curved sidewall is exposed;
    an interface material over the semiconductor die; and
    an underfill material around and in physical contact with the interface material.

2. The semiconductor device of claim 1, wherein the interface material has a first width and the semiconductor die has a second width smaller than the first width.

3. The semiconductor device of claim 1, wherein the interface material has a first width and the semiconductor die has a second width greater than the first width.

4. The semiconductor device of claim 1, wherein the interface material has a first width and the semiconductor die has the first width.

5. The semiconductor device of claim 1, wherein the interface material fills a region between the curved sidewall and the sidewall of the semiconductor die.

6. The semiconductor device of claim 1, wherein the underfill material fills a region between the curved sidewall and the sidewall of the semiconductor die.

7. The semiconductor device of claim 1, wherein the interface material has a thermal conductivity of between about 15 W/K*m and about 23 W/K*m, has a stiffness of between about 250 N/mm and about 2500 N/mm, and has a tackiness of between about 0.5 N*mm and about 10 N*mm.

8. A semiconductor device comprising:
    an interface material extending between a first package and a semiconductor die, the first package being electrically connected to the semiconductor die by through vias, the through vias having a height greater than the semiconductor die;
    an encapsulant surrounding the through vias and the semiconductor die, the encapsulant having a curved surface interfacing with a sidewall of the semiconductor die; and
    an underfill material surrounding the interface material and extending between the first package and the encapsulant.

9. The semiconductor device of claim 8, wherein the underfill is in physical contact with the curved surface.

10. The semiconductor device of claim 8, wherein the interface material is in physical contact with the curved surface.

11. The semiconductor device of claim 8, wherein the encapsulant has a first thickness and the semiconductor die has a second thickness less than the first thickness.

12. The semiconductor device of claim 8, wherein the interface material has a thermal conductivity of between about 15 W/K*m and about 23 W/K*m.

13. The semiconductor device of claim 8, wherein the interface material overlies the sidewall of the semiconductor die.

14. The semiconductor device of claim 8, wherein the interface material comprises discontinuous sections.

15. A semiconductor device comprising:
- a semiconductor die adjacent to a through via;
- an encapsulant between the semiconductor die and the through via, the encapsulant exposing a portion of a sidewall of the semiconductor die, the encapsulant having a curved portion;
- an interface material over the semiconductor die but not over the through via;
- a package in physical contact and compressing the interface material; and
- an underfill between the package and the semiconductor die.

16. The method of claim 15, wherein the underfill covers the portion of the sidewall of the semiconductor die.

17. The method of claim 15, wherein the interface material covers the portion of the sidewall of the semiconductor die.

18. The method of claim 15, wherein the interface material has a first width and the semiconductor die has a second width smaller than the first width.

19. The method of claim 15, wherein the interface material has a first width and the semiconductor die has a second width greater than the first width.

20. The method of claim 15, wherein the interface material has a first width and the semiconductor die has the first width.

* * * * *

UNITED STATES PATENT AND TRADEMARK OFFICE
CERTIFICATE OF CORRECTION

| | | |
|---|---|---|
| PATENT NO. | : 11,830,821 B2 | Page 1 of 1 |
| APPLICATION NO. | : 17/150300 | |
| DATED | : November 28, 2023 | |
| INVENTOR(S) | : Chen et al. | |

It is certified that error appears in the above-identified patent and that said Letters Patent is hereby corrected as shown below:

In the Claims

In Column 21, in Claim 16, Line 18, delete "method" and insert -- semiconductor device --.

In Column 21, in Claim 17, Line 20, delete "method" and insert -- semiconductor device --.

In Column 21, in Claim 18, Line 23, delete "method" and insert -- semiconductor device --.

In Column 21, in Claim 19, Line 26, delete "method" and insert -- semiconductor device --.

In Column 21, in Claim 20, Line 29, delete "method" and insert -- semiconductor device --.

Signed and Sealed this
Thirteenth Day of February, 2024

Katherine Kelly Vidal
*Director of the United States Patent and Trademark Office*